(12) United States Patent
Kim et al.

(10) Patent No.: US 10,770,472 B2
(45) Date of Patent: Sep. 8, 2020

(54) MEMORY ARRAYS, AND METHODS OF FORMING MEMORY ARRAYS

(71) Applicant: Micron Technology, Inc., Boise, ID (US)

(72) Inventors: Changhan Kim, Boise, ID (US); Gianpietro Carnevale, Bottanuco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/177,220

(22) Filed: Oct. 31, 2018

(65) Prior Publication Data

US 2020/0135745 A1 Apr. 30, 2020

(51) Int. Cl.
| | |
|---|---|
| *H01L 27/1157* | (2017.01) |
| *G11C 16/08* | (2006.01) |
| *H01L 27/11582* | (2017.01) |
| *G06F 3/06* | (2006.01) |
| *H01L 27/11573* | (2017.01) |
| *G11C 8/14* | (2006.01) |

(52) U.S. Cl.
CPC ........ *H01L 27/1157* (2013.01); *G06F 3/0688* (2013.01); *G11C 8/14* (2013.01); *G11C 16/08* (2013.01); *H01L 27/11573* (2013.01); *H01L 27/11582* (2013.01)

(58) Field of Classification Search
None
See application file for complete search history.

(56) References Cited

U.S. PATENT DOCUMENTS

2016/0163725 A1* 6/2016 Kamiya ............ H01L 27/11521
257/321

* cited by examiner

*Primary Examiner* — Long Pham
(74) *Attorney, Agent, or Firm* — Wells St. John P.S.

(57) ABSTRACT

Some embodiments include a memory array having a vertical stack of alternating insulative levels and wordline levels. Channel material extends along the stack. Conductive segments are along the wordline levels. Each of the conductive segments has, along a cross-section, first and second ends in opposing relation to one another. The conductive segments include gates and wordlines adjacent the gates. The wordlines encompass the second ends, and the gates have rounded (e.g., substantially parabolic) noses which encompass the first ends. Some embodiments include methods of forming integrated assemblies.

10 Claims, 28 Drawing Sheets

MEMORY ARRAYS, AND METHODS OF FORMING MEMORY ARRAYS

TECHNICAL FIELD

Memory arrays (e.g., NAND memory arrays), and methods of forming memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_i$, tile column$_j$, and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to 206M. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It would be desirable to develop improved memory cell designs, improved memory array architecture (e.g., improved NAND architecture), and methods for fabricating the improved memory cells and improved memory array architectures.

DETAILED DESCRIPTION OF THE
ILLUSTRATED EMBODIMENTS

Some embodiments include memory arrays (e.g., NAND memory arrays) having vertically-stacked conductive segments. The conductive segments have first and second ends in opposing relation to one another. Wordlines encompass the second ends, and transistor gates encompass the first ends. The transistor gates may have rounded noses (e.g., substantially parabolic noses). Channel material extends vertically along the vertically-stacked conductive segments. The rounded noses are spaced from the channel material by memory cell structures which include dielectric barrier material, charge-blocking material, and charge-storage material. Some embodiments include methods of forming integrated assemblies. Example methods are described with reference to FIGS. 5-26, 27A and 27B.

Figure 1:
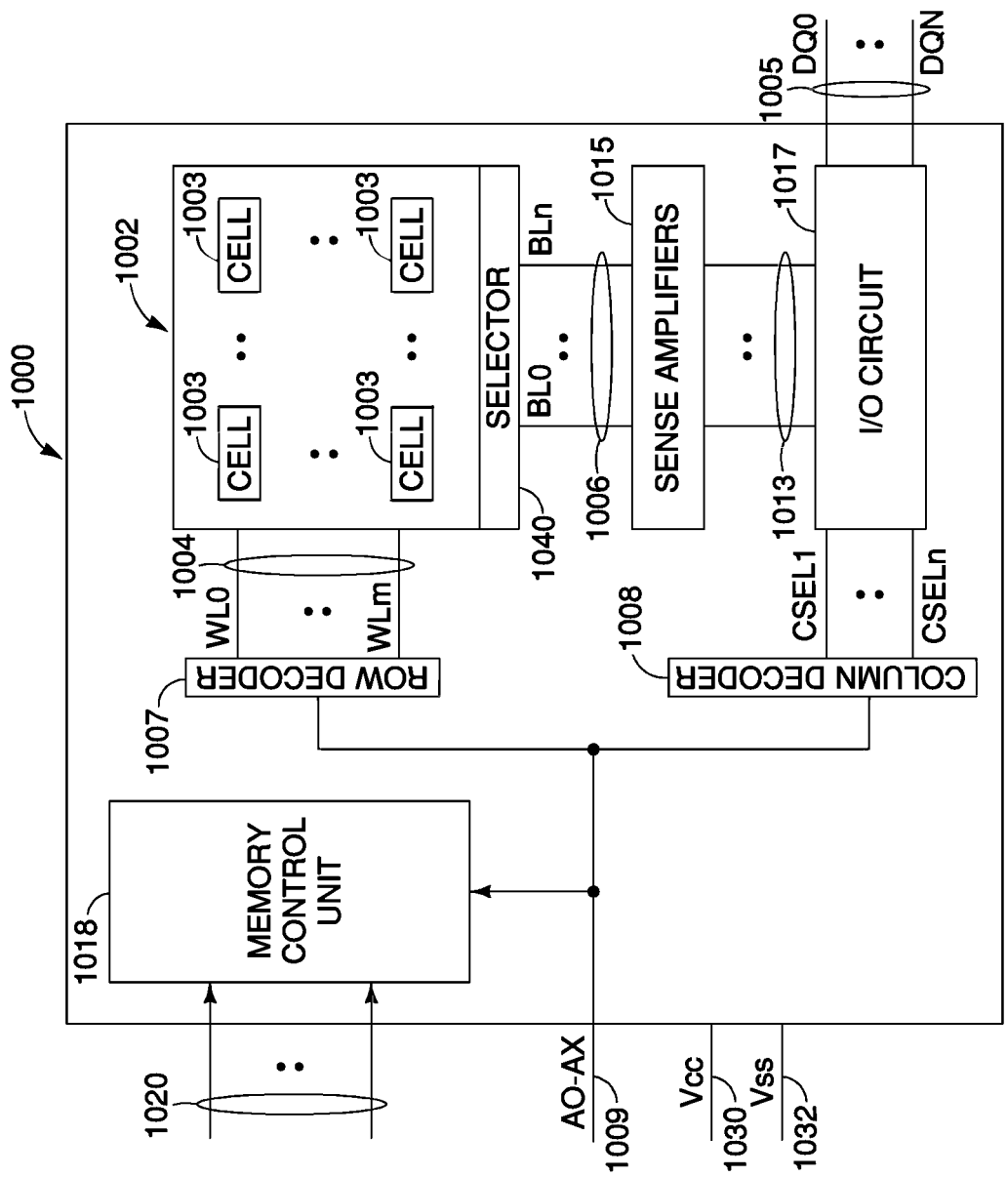
FIG. 1 shows a block diagram of a prior art memory device having a memory array with memory cells.
Figure 2:
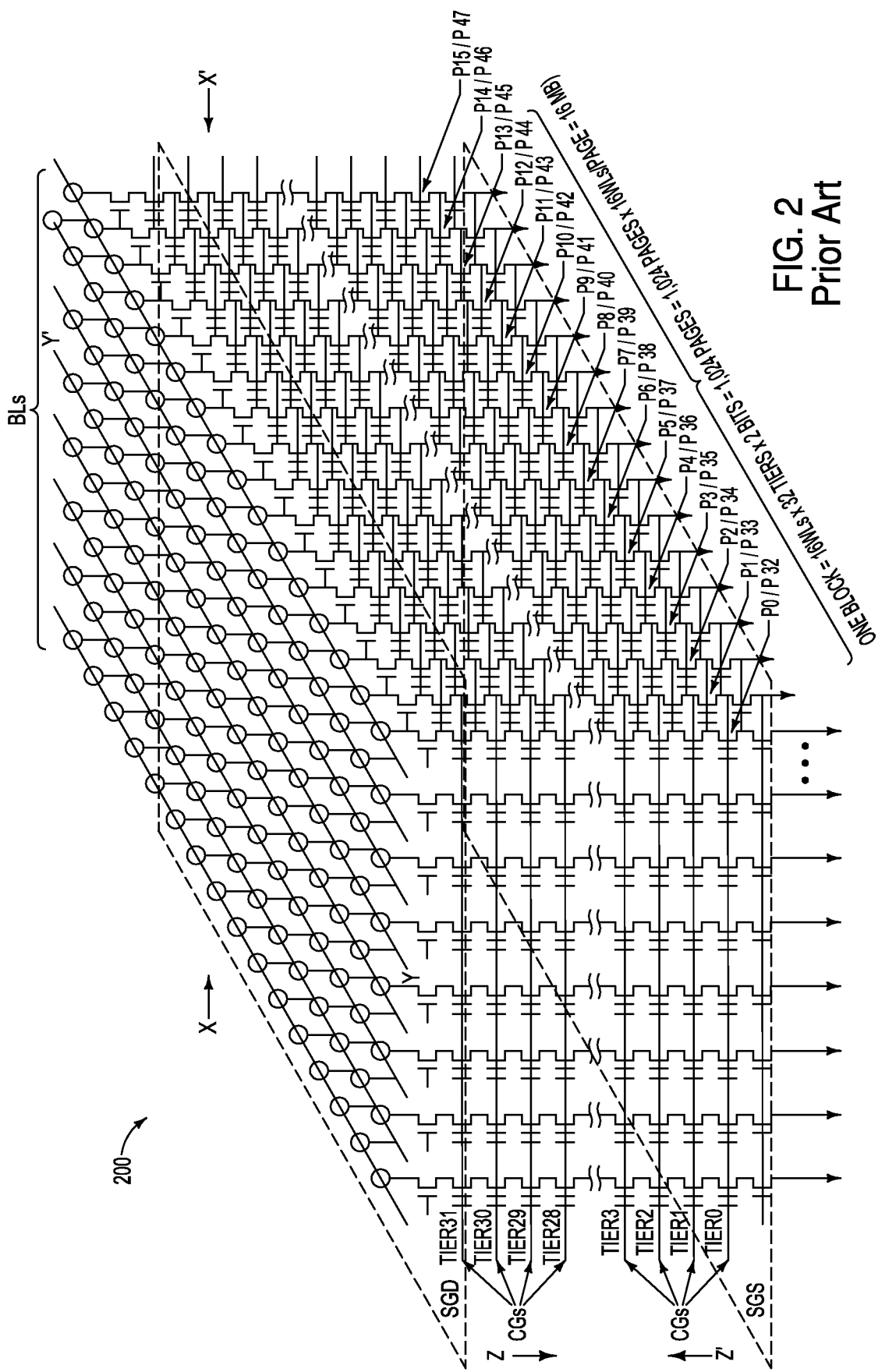
FIG. 2 shows a schematic diagram of the prior art memory array of FIG. 1 in the form of a 3D NAND memory device.
Figure 3:
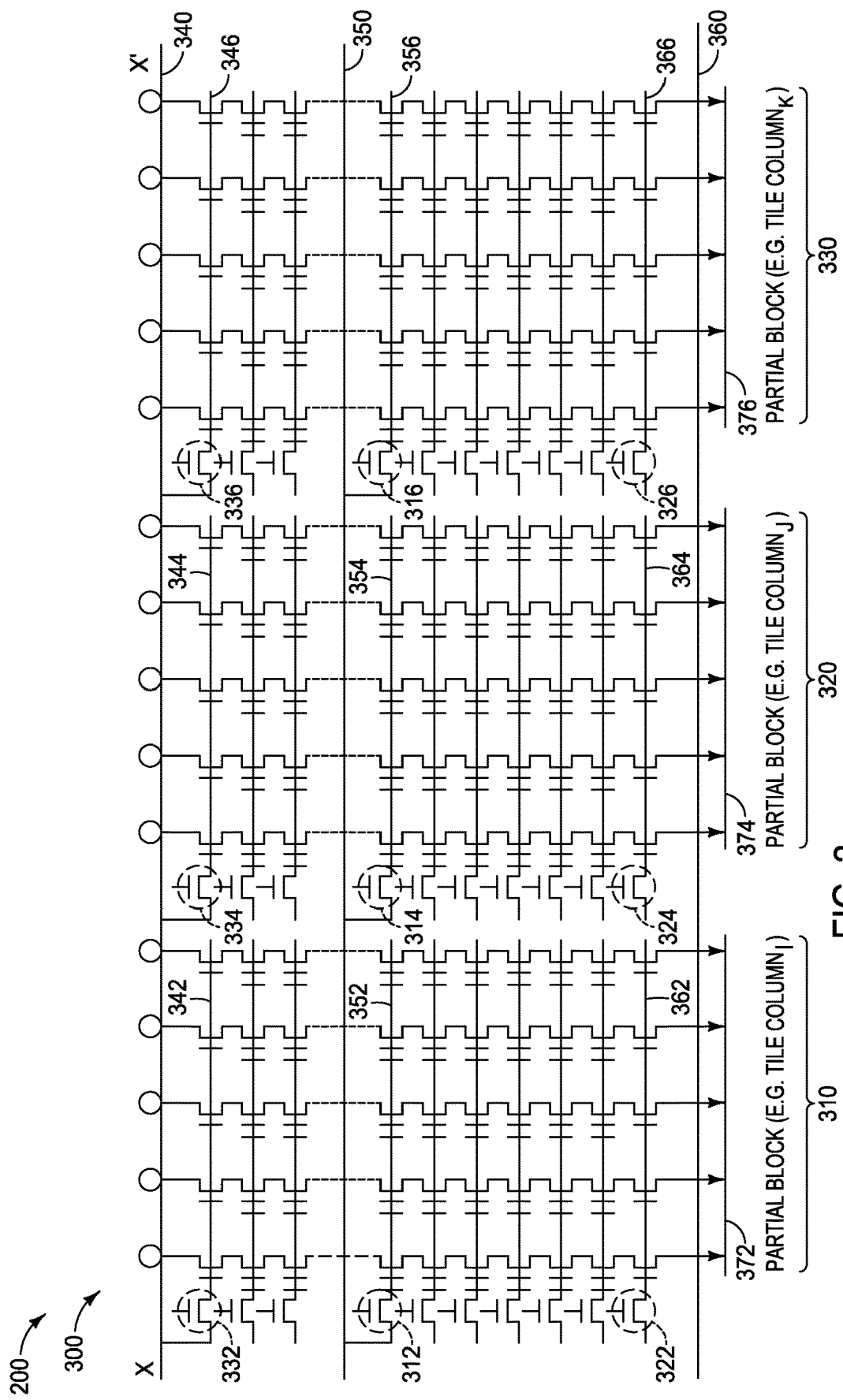
FIG. 3 shows a cross-sectional view of the prior art 3D NAND memory device of FIG. 2 in an X-X' direction.
Figure 4:
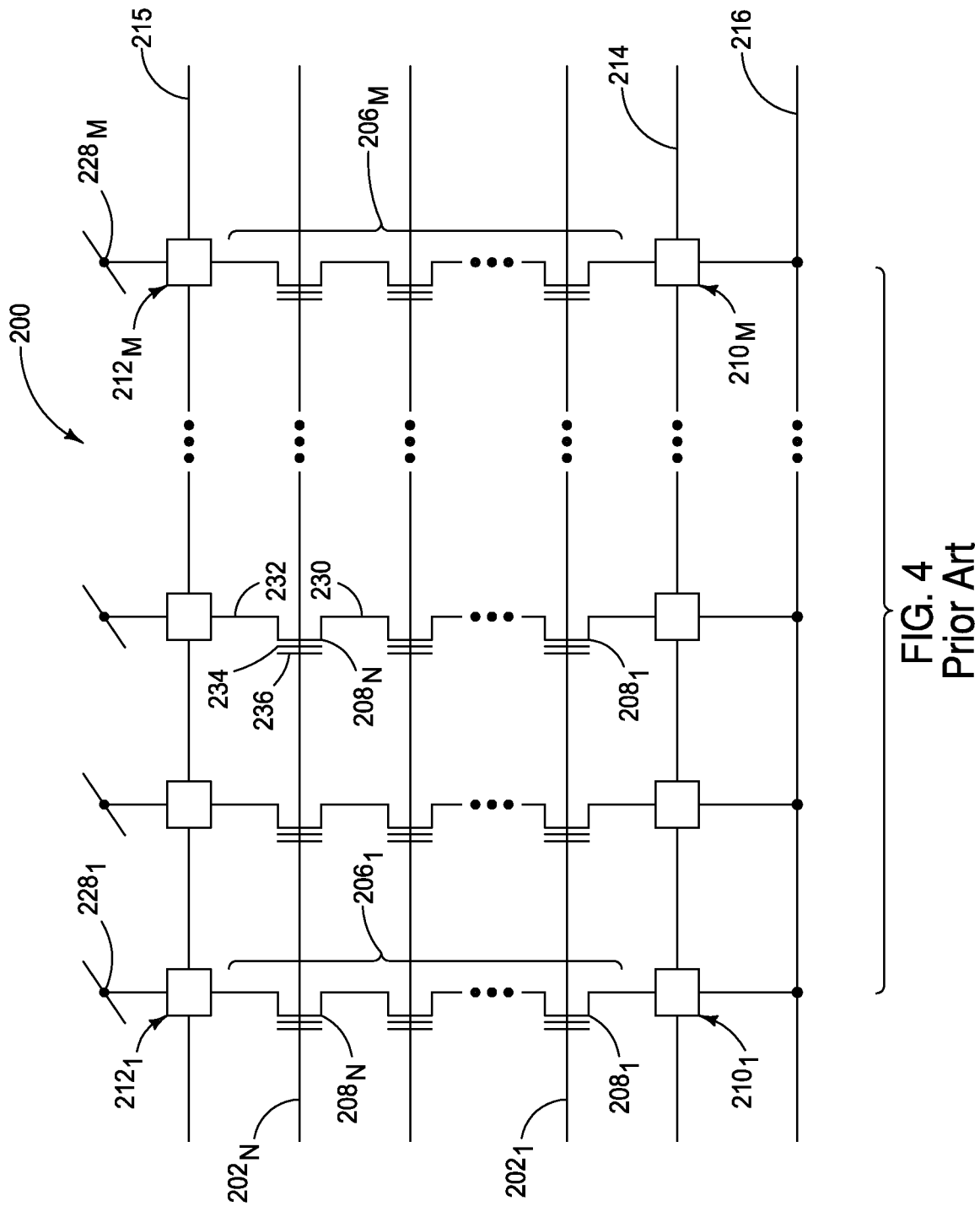
FIG. 4 is a schematic diagram of a prior art NAND memory array.
Figure 5:
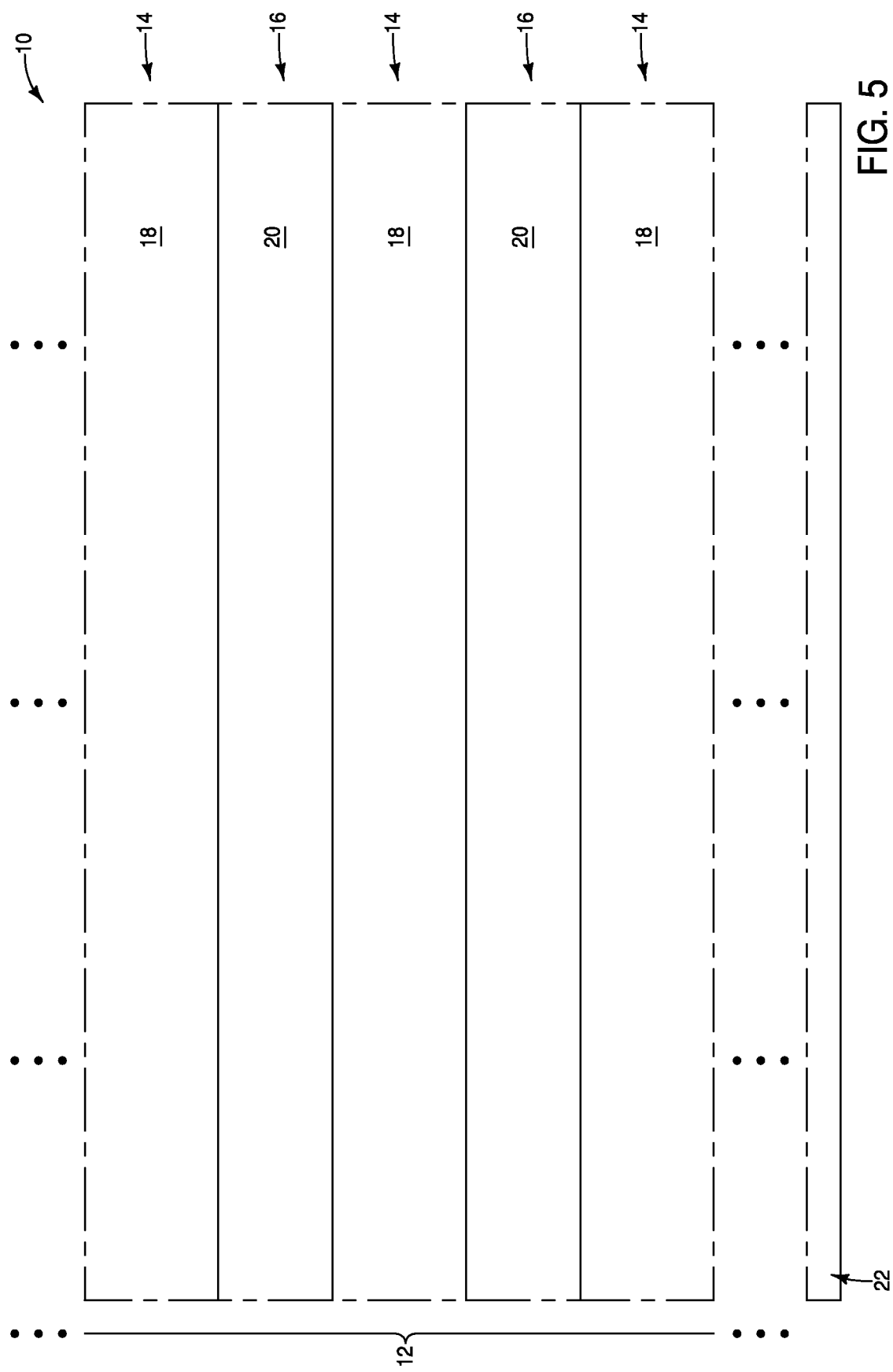
FIGS. 5-14 are diagrammatic cross-sectional views of regions of a construction at example process steps of an example method for fabricating an example assembly.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first and second materials 18 and 20 may be any suitable materials. In some embodiments, the first material 18 may comprise, consist essentially of, or consist of silicon nitride; and the second material 20 may comprise, consist essentially of, or consist of silicon dioxide. The second material 20 may be electrically insulative, and in some embodiments may be referred to as an insulative second material.

The levels 14 and 16 may be of any suitable thicknesses; and may be the same thickness as one another, or different thicknesses relative to one another. In some embodiments, the levels 14 and 16 may have vertical thicknesses within a range of from about 3 nanometers (nm) to about 400 nm; within a range of from about 3 nm to about 50 nm, etc.

In some embodiments, the second levels 16 may be thinner than the first levels 14. In an example embodiment, the second levels 16 may have thicknesses of about 7 nm, and the first levels 14 may have thicknesses of about 9 nm. In other embodiments, the second levels 16 may be thicker than the first levels 14.

Some of the material 18 of the first levels 14 is ultimately replaced with conductive material of memory cell gates. Accordingly, the levels 14 may ultimately correspond to memory cell levels of a NAND configuration. The NAND configuration will include strings of memory cells (i.e., NAND strings), with the number of memory cells in the strings being determined by the number of vertically-stacked levels 14. The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend outwardly beyond the illustrated region of the stack to indicate that there may be more vertically-stacked levels than those specifically illustrated in the diagram of FIG. 5.

The stack 12 is shown to be supported over a base 22. The base 22 may comprise semiconductor material; and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

A space is provided between the stack 12 and the base 22 to indicate that other components and materials may be provided between the stack 12 and the base 22. Such other components and materials may comprise additional levels of the stack, a source line level, source-side select gates (SGSs), etc.

Figure 6:
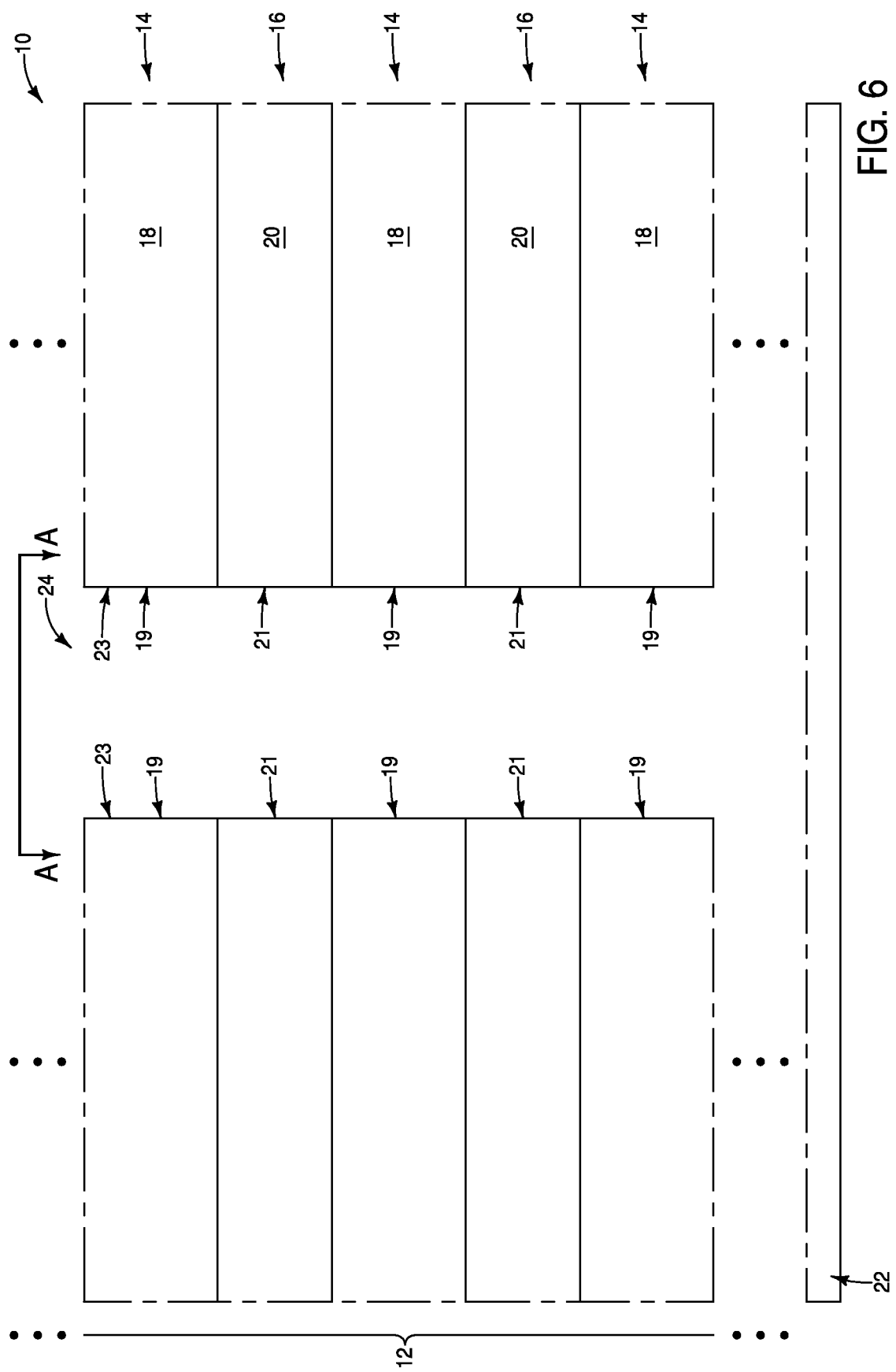
Figure 6A:
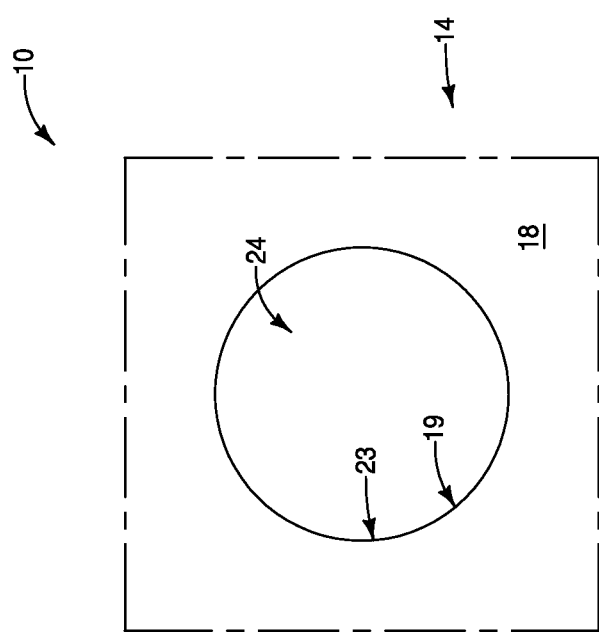
FIG. 6A is diagrammatic top view along the line A-A of FIG. 6.

Referring to FIG. 6, an opening 24 is formed through the stack 12. The opening is ultimately utilized for fabricating channel material pillars associated with vertically-stacked memory cells of a memory array, and in some embodiments may be referred to as a pillar opening. The opening 24 may have any suitable configuration when viewed from above; and in some example embodiments may be circular, elliptical, polygonal, etc. FIG. 6A shows a top view of a portion of the top level 14 of the illustrated region of construction 10, and illustrates an example configuration in which the opening 24 is circular-shaped when viewed from above. In some embodiments, the opening 24 may be referred to as a first opening in order to distinguish it from other openings formed at later process stages. The pillar opening 24 may be representative of a large plurality of substantially identical openings formed across the base 22 at the processing stage of FIG. 6 (with the term "substantially identical" meaning identical to within reasonable tolerances of fabrication and measurement).

The first levels 14 comprise edges 19 along the opening 24, and the second levels 16 comprise edges 21 along the opening. The edges 19 and 21 may be referred to as first and second edges, respectively; and together form sidewalls 23 along the opening 24.

Figure 7:
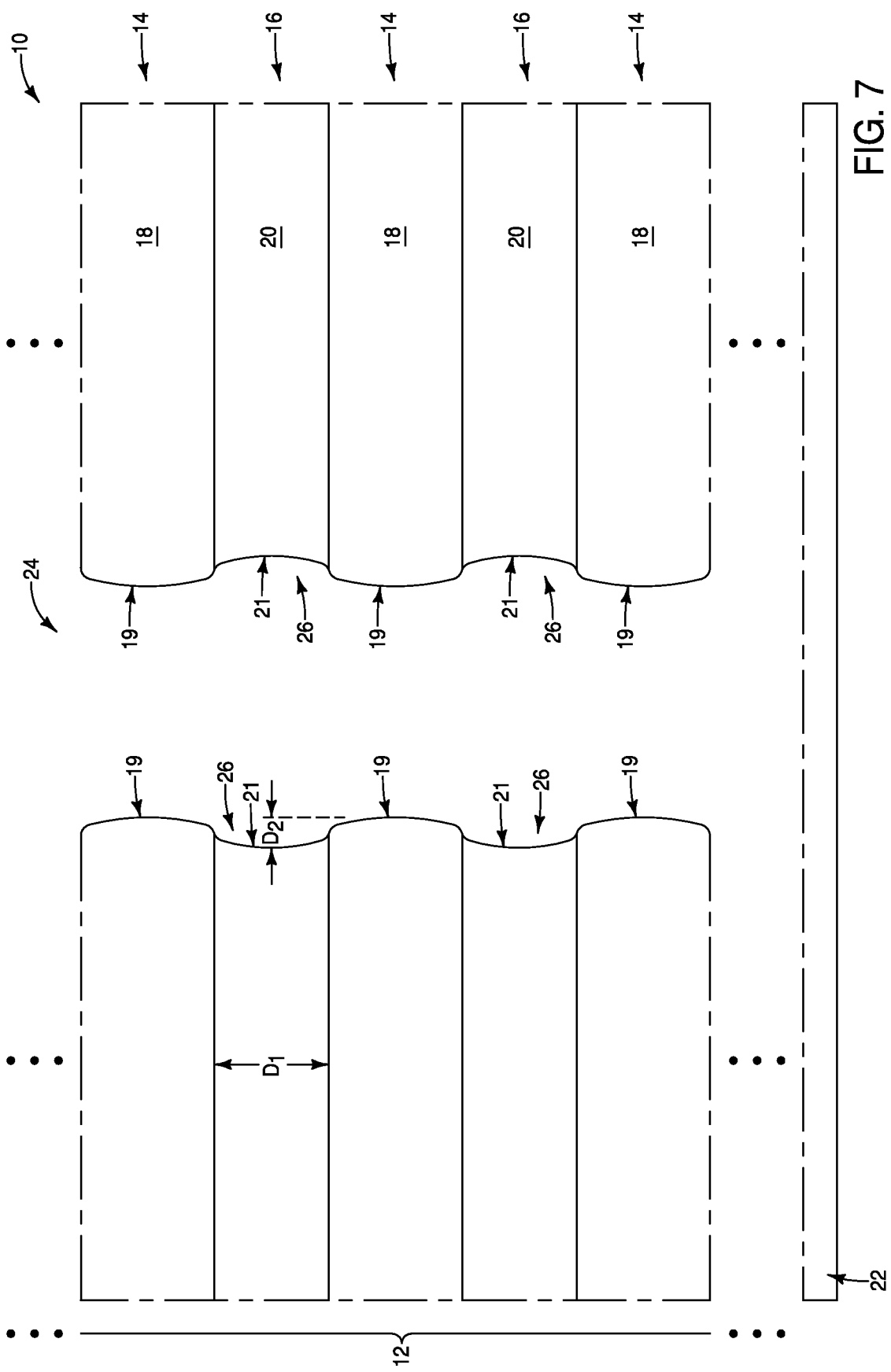

Referring to FIG. 7, the edges 21 of the second levels 16 are recessed with an appropriate etch. For instance, if the second material 20 comprises silicon dioxide, the edges 21 may be recessed with an etch utilizing hydrofluoric acid (HF), such as, for example, a buffered oxide etch or a vapor etch.

The etch utilized to recess the edges 21 of the second levels 16 also rounds the edges 19 of the first levels 14.

The recessing of the edges 21 insets such edges to leave recesses 26 between vertically-adjacent rounded edges of the first levels 14.

In some embodiments, the second levels 16 may be considered to have vertical thicknesses of a first dimension $D_1$, and the recesses 26 may depths (specifically, horizontal depths) of a second dimension $D_2$. The second dimension $D_2$ may be at least about 10% of the first dimension $D_1$, at least about 20% of the first dimension $D_1$, at least about 40% of the first dimension $D_1$, at least about 60% of the first dimension $D_1$, etc. In some embodiments, the second dimension $D_2$ is at least about one-half of the first dimension $D_1$. For instance, the first dimension $D_1$ may be about 9 nm, and the second dimension $D_2$ may be at least about 5 nm.

In some embodiments, the edges 19 and 21 may be referred to as first and second edges, respectively.

Figure 8:
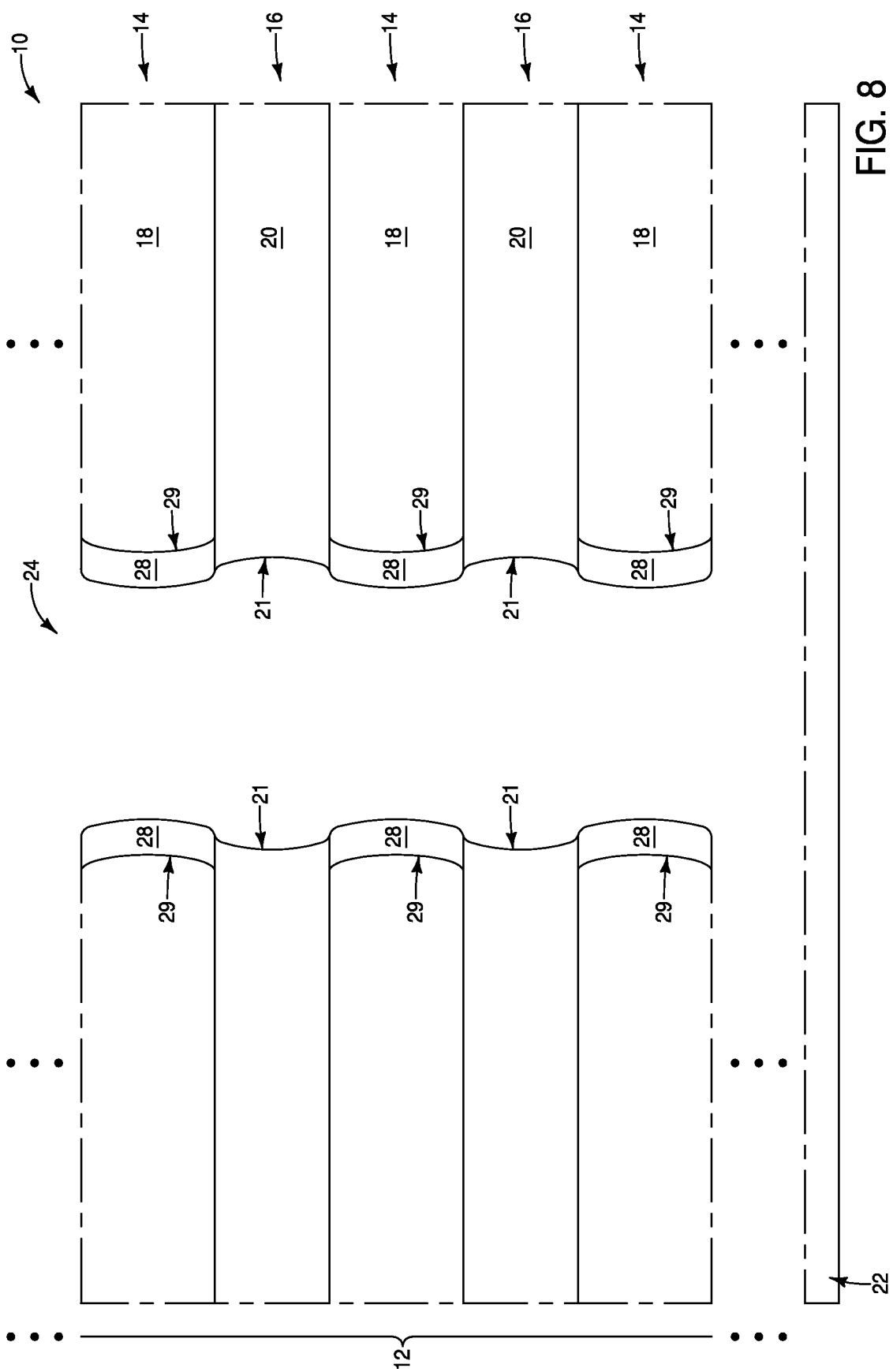

Referring to FIG. 8, the rounded edges 19 (FIG. 7) of material 18 are oxidized to form a material 28 comprising silicon, nitrogen and oxygen. In some embodiments, the material 28 may comprise, consist essentially of, or consist of silicon oxynitride. The material 28 along each of the levels 14 has an inner edge (i.e., inner surface) 29. The inner edges 29 are rounded, and may be conformal to the rounded edges 19 (FIG. 7) formed along the first levels 14. In some embodiments, the inner edges 29 may be considered to comprise rounded shapes patterned by the rounded shapes of the edges 19 (FIG. 7).

The oxidation of material 18 may utilize any suitable chemistry and operational parameters. In some example embodiments, the oxidation may comprise an operational temperature of the ambient adjacent the oxidizing surfaces and/or the operational temperature of the oxidizing surfaces of at least about 700° C. (but not limited to being at least about 700°, and may be lower if suitable oxidative conditions achieve desired electrical and/or other properties). The oxidation may, for example, utilize steam (for instance, in situ steam generation (ISSG)) as a source of the oxidant, and/or may utilize plasma to generate oxidizing species. The plasma may be a so-called "remote plasma", meaning that the plasma does not contact the surfaces within opening 24 which are to be oxidized, but instead only the oxidizing species generated by such plasma reach the oxidizing surfaces.

The material 28 may correspond to charge-blocking material in some embodiments. Such charge-blocking material may be formed to any suitable horizontal thickness; such as, for example, a horizontal thickness within a range of from about 5 nm to about 15 nm.

Figure 9:
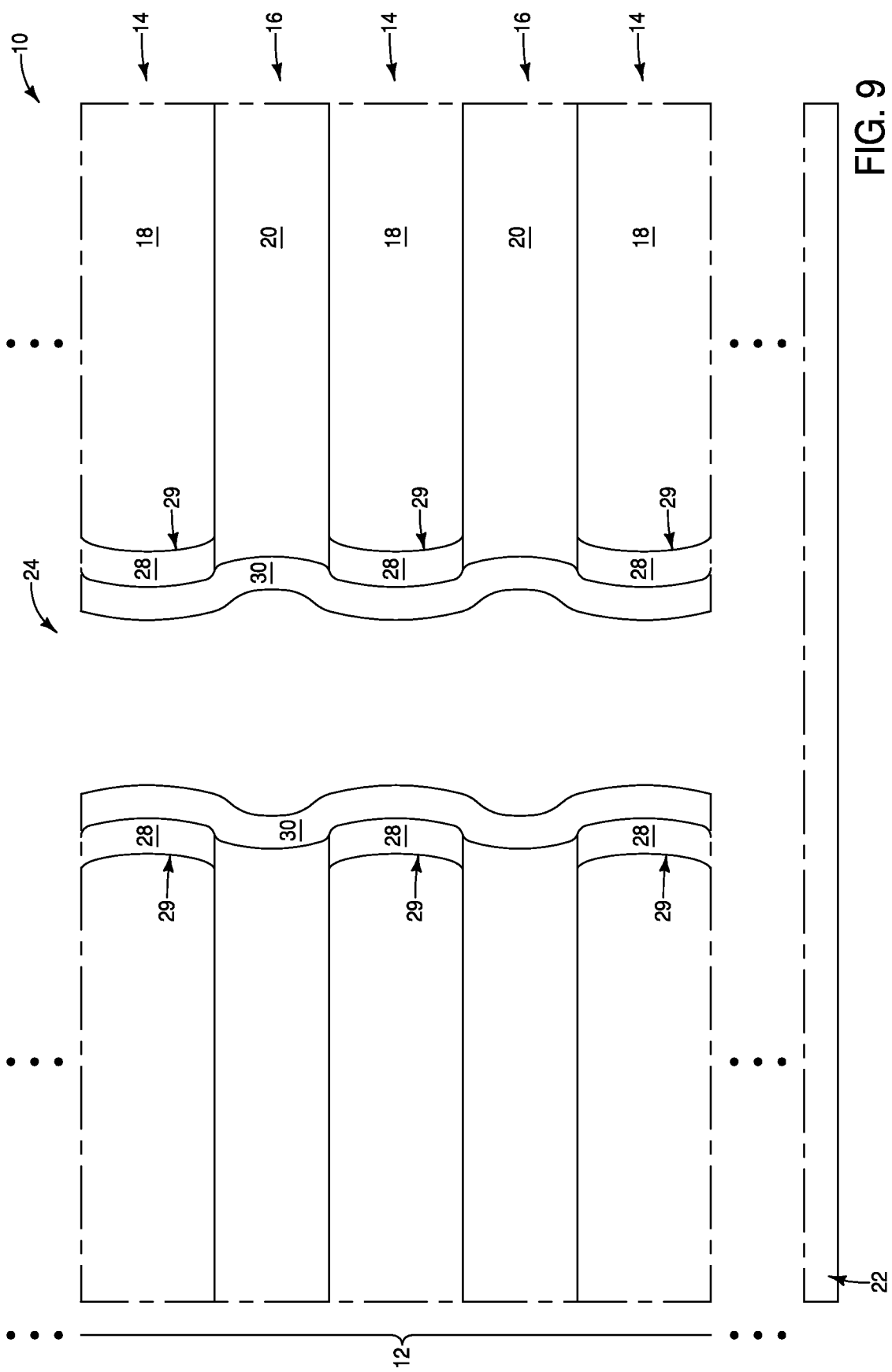

Referring to FIG. 9, charge-storage material 30 is formed adjacent the charge-blocking material 28, and in the shown embodiment is formed to be directly against the charge-blocking material 28. The charge-storage material may comprise any suitable composition(s); and in some embodiments may comprise charge-trapping materials, such as silicon nitride, silicon oxynitride, conductive nanodots, etc. Persons of ordinary skill understand the term "charge-trapping"; and will understand that a "charge trap" may refer to an energy well that can reversibly capture a charge carrier (e.g., an electron or hole). In alternative embodiments (not shown), the charge-storage material may be configured as floating gate material (such as, for example, polycrystalline silicon). In some embodiments, the charge-trapping material 30 may comprise, consist essentially of, or consist of silicon nitride.

Figure 10:
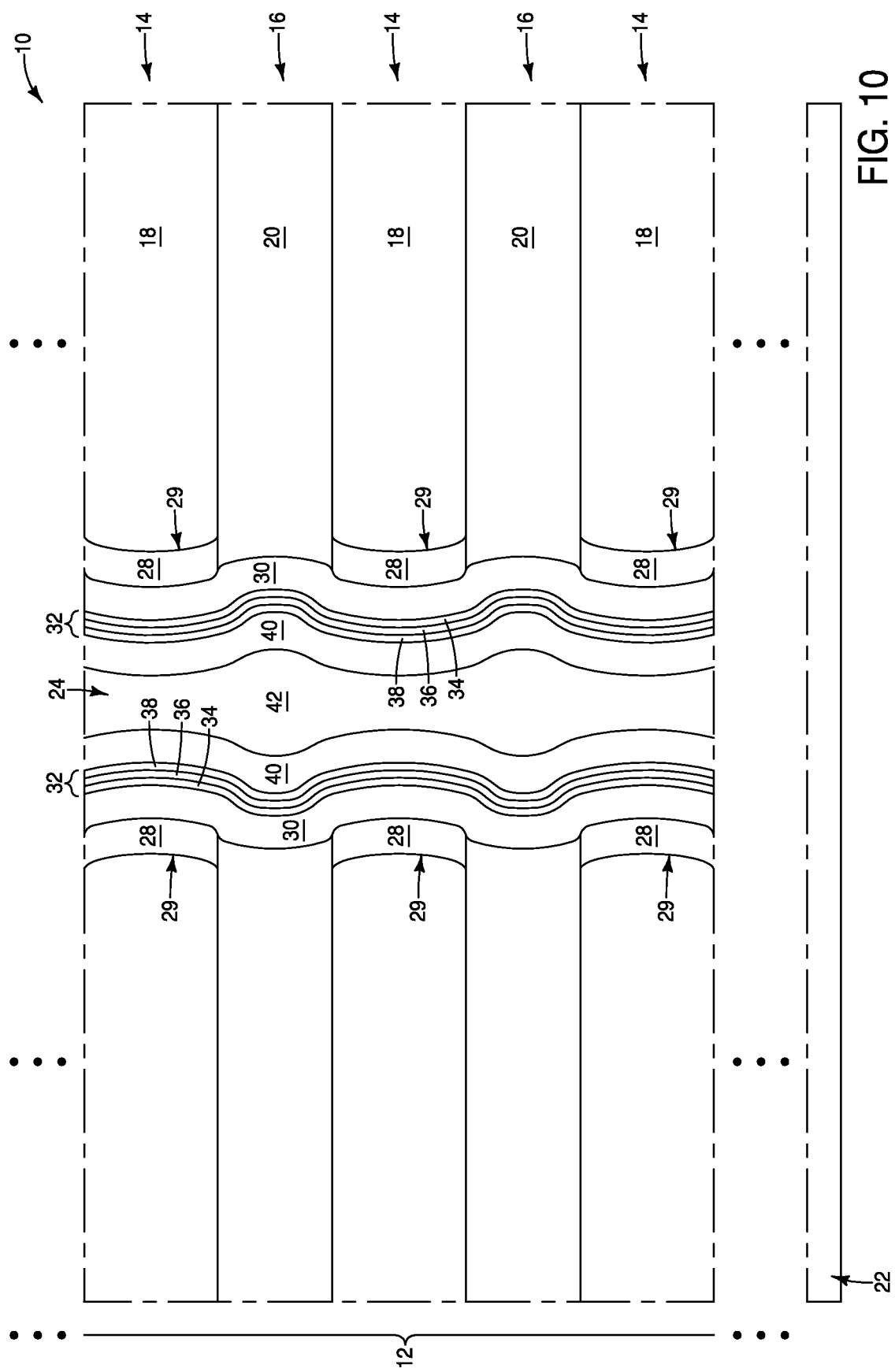

Referring to FIG. 10, tunneling structures 32 are formed adjacent the charge-trapping material 30, and in the shown embodiment are formed to be directly against the charge-trapping material 30.

The tunneling structures 32 comprise tunneling materials 34, 36 and 38. The tunneling materials can function as materials through which charge carriers tunnel or otherwise pass during programming operations, erasing operations, etc. In some contexts, one or more of the tunneling materials may be referred to as gate dielectric material, or simply as dielectric material. In the illustrated embodiment, three tunneling materials are utilized. In other embodiments, there may be fewer than three tunneling materials; and in yet other embodiments there may be more than three tunneling materials. In some embodiments, the tunneling materials 34, 36 and 38 may be band-gap engineered to have desired charge-tunneling properties. The tunneling material 36 is compositionally different from the materials 34 and 38. The materials 34 and 38 may be compositionally different from one another in some embodiments, and may be compositionally the same as one another in other embodiments.

In some example embodiments, the tunneling material 36 may comprise silicon nitride, and the tunneling materials 34 and 38 may comprise silicon dioxide.

In some embodiments, the tunneling materials 34, 36 and 38 may be referred to as first, second and third tunneling materials, respectively.

Channel material 40 is formed within the opening 24 and along the tunneling materials 34, 36 and 38. In the illustrated embodiment, the channel material 40 is directly against the tunneling material 38. The channel material 40 may comprise any suitable appropriately-doped semiconductor material(s); and in some embodiments may comprise one or more of silicon, germanium, III/V semiconductor materials (e.g., gallium phosphide), etc., (with groups III and V being old nomenclature, and now being referred to as groups 13 and 15)

In the illustrated embodiment, the channel material 40 lines a periphery of the opening 24, and insulative material 42 fills a remaining interior region of the opening 24. The insulative material 42 may comprise any suitable composition or combination of compositions, such as, for example, silicon dioxide. The illustrated configuration of the channel material 40 may be considered to be a hollow channel configuration, in that the insulative material 42 is provided within a "hollow" in the channel configuration. In other embodiments, the channel material may be configured as a solid pillar.

The channel material 40 extends vertically along the periphery of opening 24; or, in other words, extends vertically through the stack 12.

Figure 11:
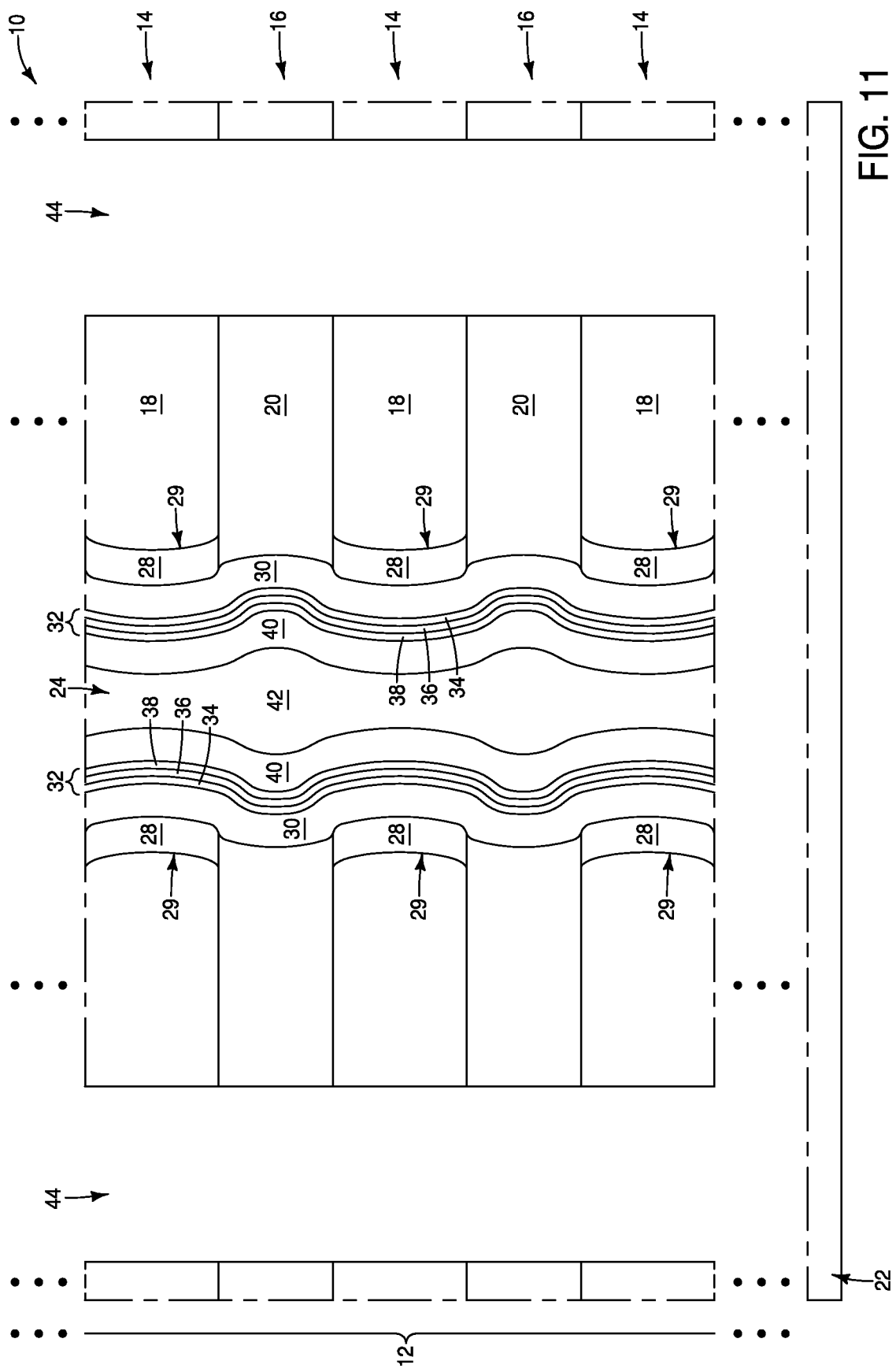

Referring to FIG. 11, second openings 44 (e.g., slits) are formed through the stack 12.

Figure 12:
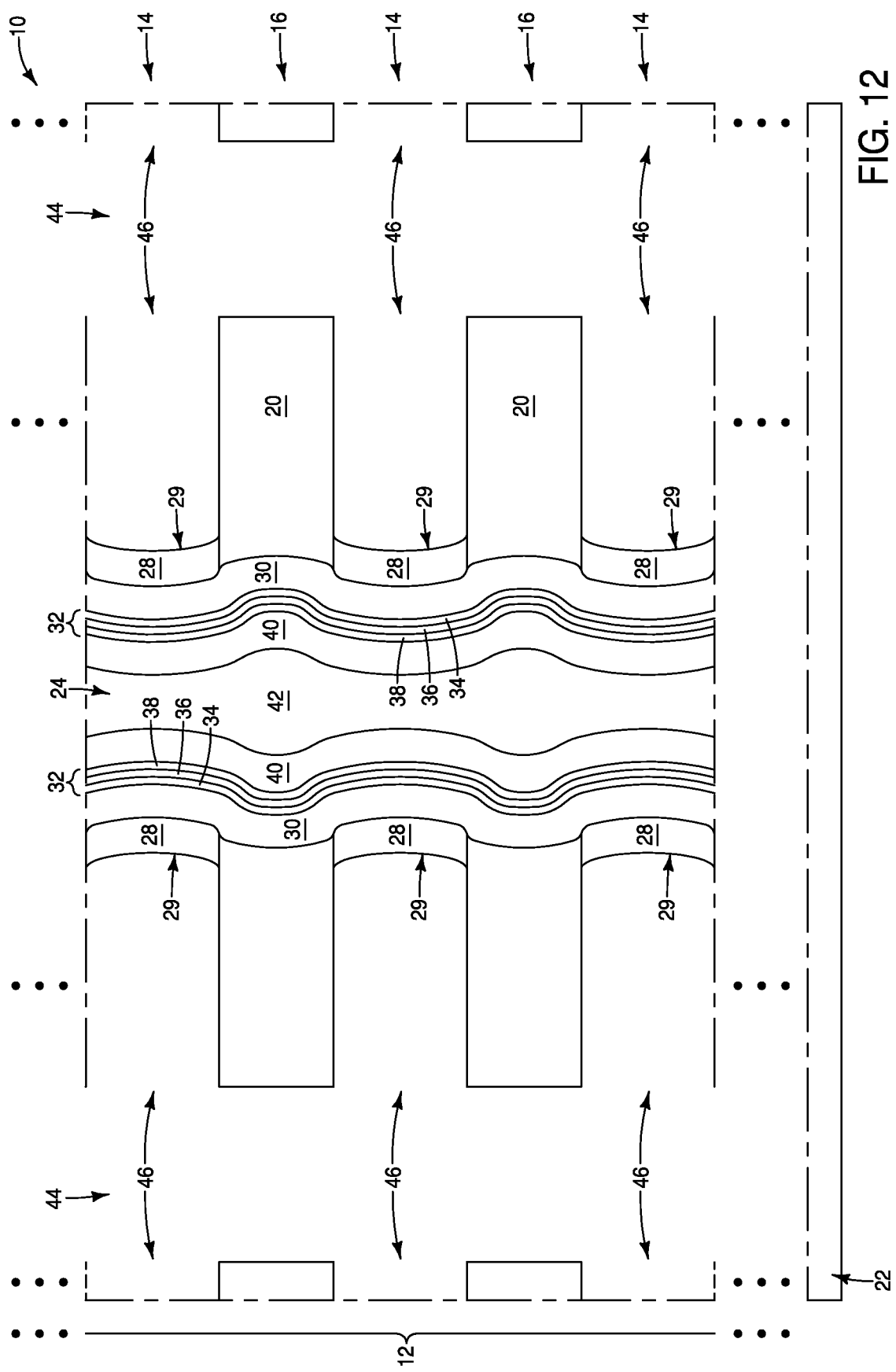

Referring to FIG. 12, the first material 18 (FIG. 11) of the first levels 14 is removed to form cavities 46 along the first levels 14. The cavities 46 have peripheral edges which include the inner edges 29 of the charge-blocking material 28.

Figure 13:
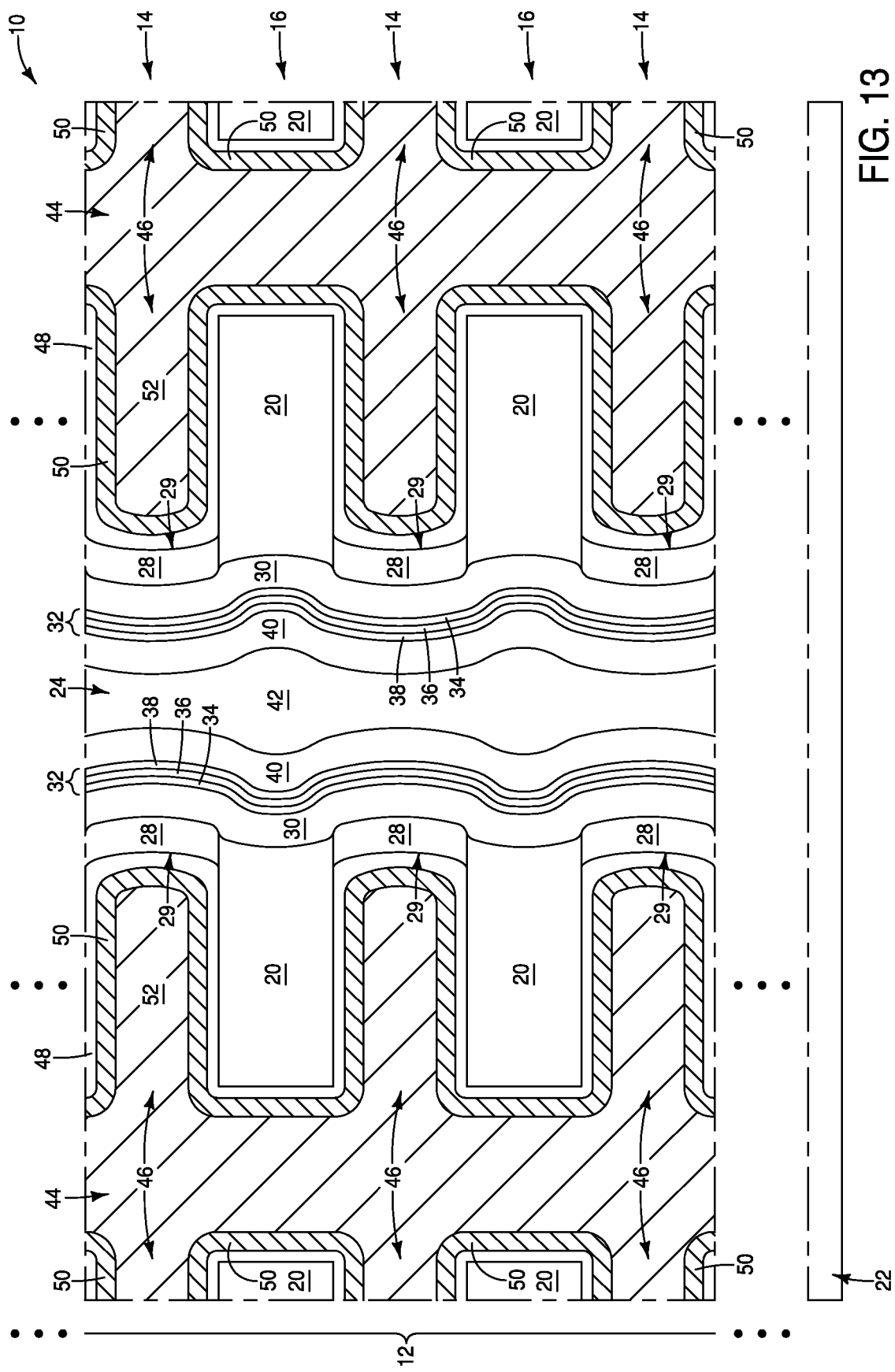

Referring to FIG. 13, dielectric barrier material 48 is formed within the cavities 46; and conductive materials 50 and 52 are provided within the lined cavities.

The dielectric barrier material 48 may comprise any suitable composition(s); and in some embodiments may comprise one or more high-k materials (with the term high-k meaning a dielectric constant greater than that of silicon dioxide). Example compositions which may be incorporated into the dielectric barrier material are hafnium oxide, zirconium oxide, aluminum oxide, hafnium silicate, zirconium silicate, titanium oxide, gadolinium oxide, niobium oxide, tantalum oxide, etc.

The conductive materials 50 and 52 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 50 may comprise, consist essentially of, or consist of titanium nitride; and the conductive material 52 may comprise, consist essentially of, or consist of tungsten.

Figure 14:
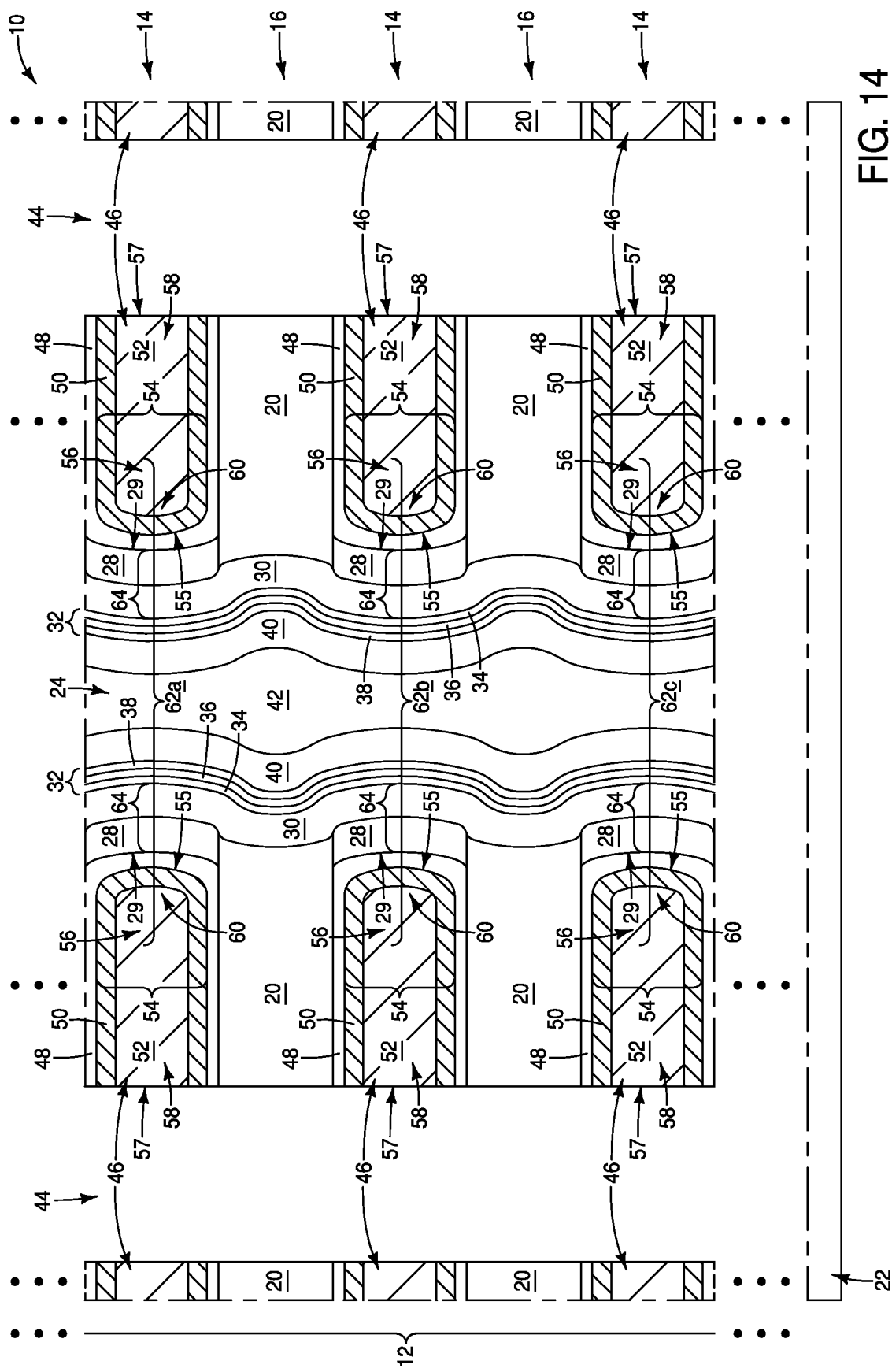

Referring to FIG. 14, conductive materials 50 and 52 are removed from within central regions of openings 44, while leaving the conductive materials 50 and 52 within the cavities 46.

The conductive materials 50 and 52 remaining within the cavities 46 together form conductive segments (or regions) 54. Although the illustrated conductive segments 54 comprise two conductive materials, in other embodiments analogous conductive regions may comprise only a single conductive material, or may comprise more than two conductive materials.

Portions of the conductive segments 54 proximate the charge-blocking material 28 may correspond to conductive gates 56, and portions of the conductive segments 54 more distal from the charge-blocking material 28 may correspond to wordlines 58. The wordlines are along the levels 14, and accordingly in some embodiments the levels 14 may be referred to as wordline levels. Such wordline levels may be considered to alternate with the insulative levels 16 within the vertical stack 12 of FIG. 14.

In some embodiments, the conductive segments 54 may be considered to comprise first ends 55, and to comprise second ends 57 in opposing relation to the first ends (at least along the cross-section of FIG. 14). The first ends 55 are comprised by the gates 56, and may be referred to as gate ends; and the second ends 57 are comprised by the wordlines 58, and may be referred to as wordline ends.

The gate ends 55 are rounded, and specifically are patterned by the rounded inner edges 29 of the charge-blocking material 28. In some embodiments, the gate ends 55 may be considered to have a rounded shape molded by the rounded inner edges 29 of the charge-blocking material 28. As discussed above with reference to FIG. 8, the inner edges 29 may be considered to be patterned by the rounded edges 19 shown in FIG. 7. Since the rounded ends 55 have been patterned by the inner edges 29, in some embodiments such rounded ends may be considered to be patterned from a shape initially provided as the rounded edges 19 of FIG. 7.

In some embodiments, the gates 56 may be considered to comprise rounded noses 60 which encompass the first ends 55. Such rounded noses may have any suitable shapes, and in some embodiments may have substantially parabolic shapes (with the term "substantially parabolic" meaning parabolic to within reasonable tolerances of fabrication and measurement).

The assembly 10 of FIG. 14 may be considered to show a portion of a memory array (e.g., a NAND memory array).

Such array comprises the vertical stack 12 of alternating insulative levels 16 and wordline levels 14. The channel material 40 extends vertically along the stack 12. The conductive segments 54 are along the wordline levels 14.

The memory array includes memory cells 62a, 62b and 62c. The charge-blocking material 28 and the charge-storage material 30 within a memory cell may be together considered to be a memory cell structure 64. In some embodiments, the charge-blocking material 28 within a memory cell structure 64 may be referred to as a charge-blocking region of the memory cell structure, and the charge-storage material within the memory cell structure 64 may be referred to as a charge-storage region of the memory cell structure. In the shown embodiment, the charge-blocking regions (i.e., the regions of material 28) are between the charge-storage regions (i.e., the regions of material 30) and the gates 56.

The dielectric barrier material 48 is between the charge-blocking material 28 and the noses 60 of the gates 56. In the shown embodiment, the dielectric barrier material is substantially conformal to the rounded noses 60 (with the term "substantially conformal" meaning conformal to within reasonable tolerances of fabrication and measurement).

In operation, the charge-storage material 30 may be configured to store information in the memory cells 62a, 62b and 62c. The value (with the term "value" representing one bit or multiple bits) of information stored in an individual memory cell (e.g., 62a) may be based on the amount of charge (e.g., the number of electrons) stored in a charge-storage region. The amount of charge within an individual charge-storage region may be controlled (e.g., increased or decreased), at least in part, based on the value of voltage applied to an associated gate 56, and/or based on the value of voltage applied to an associated channel material 40.

The tunneling structures 32 may be configured to allow desired tunneling (e.g., transportation) of charge (e.g., electrons) between the charge-storage material 30 and the channel material 40. The tunneling structures 32 may be configured (i.e., engineered) to achieve a selected criterion, such as, for example, but not limited to, an equivalent oxide thickness (EOT). The EOT quantifies the electrical properties of the tunneling region (e.g., capacitance) in terms of a representative physical thickness. For example, EOT may be defined as the thickness of a theoretical silicon dioxide layer that would be required to have the same capacitance density as a given dielectric (e.g., a tunneling structure 32), ignoring leakage current and reliability considerations.

The charge-blocking material 28 is adjacent to the charge-storage material 30, and may provide a mechanism to block charge from flowing from the charge-storage material 30 to the associated gates 56. The dielectric barrier material 48 is provided between the charge-blocking material 28 and the associated gates 56, and may be utilized to inhibit back-tunneling of electrons from the gates 56 toward the charge-storage material 30. In some embodiments, the dielectric barrier material 48 may be considered to form dielectric barrier regions within the memory cells 62a, 62b and 62c.

Although the embodiment of FIGS. 7-14 forms the entirety of the charge-blocking material 28 as oxidized regions of the first material 18 (as shown in FIG. 8), in other embodiments regions of the charge-blocking material may be formed by depositing a charge-blocking composition over the rounded surfaces 19, or onto the charge-blocking material 28. The deposited charge-blocking composition may comprise any suitable substance(s); such as, for example, silicon dioxide.

The embodiment of FIGS. 7-14 forms the dielectric barrier material 48 within the cavities 46 (FIG. 12), and conformally to the rounded noses 60 of the gates 56 (FIG. 14). In other embodiments, the dielectric barrier material 48 may be formed in other locations. An example of such other embodiments is described with reference to FIGS. 15-19.

Figure 15:
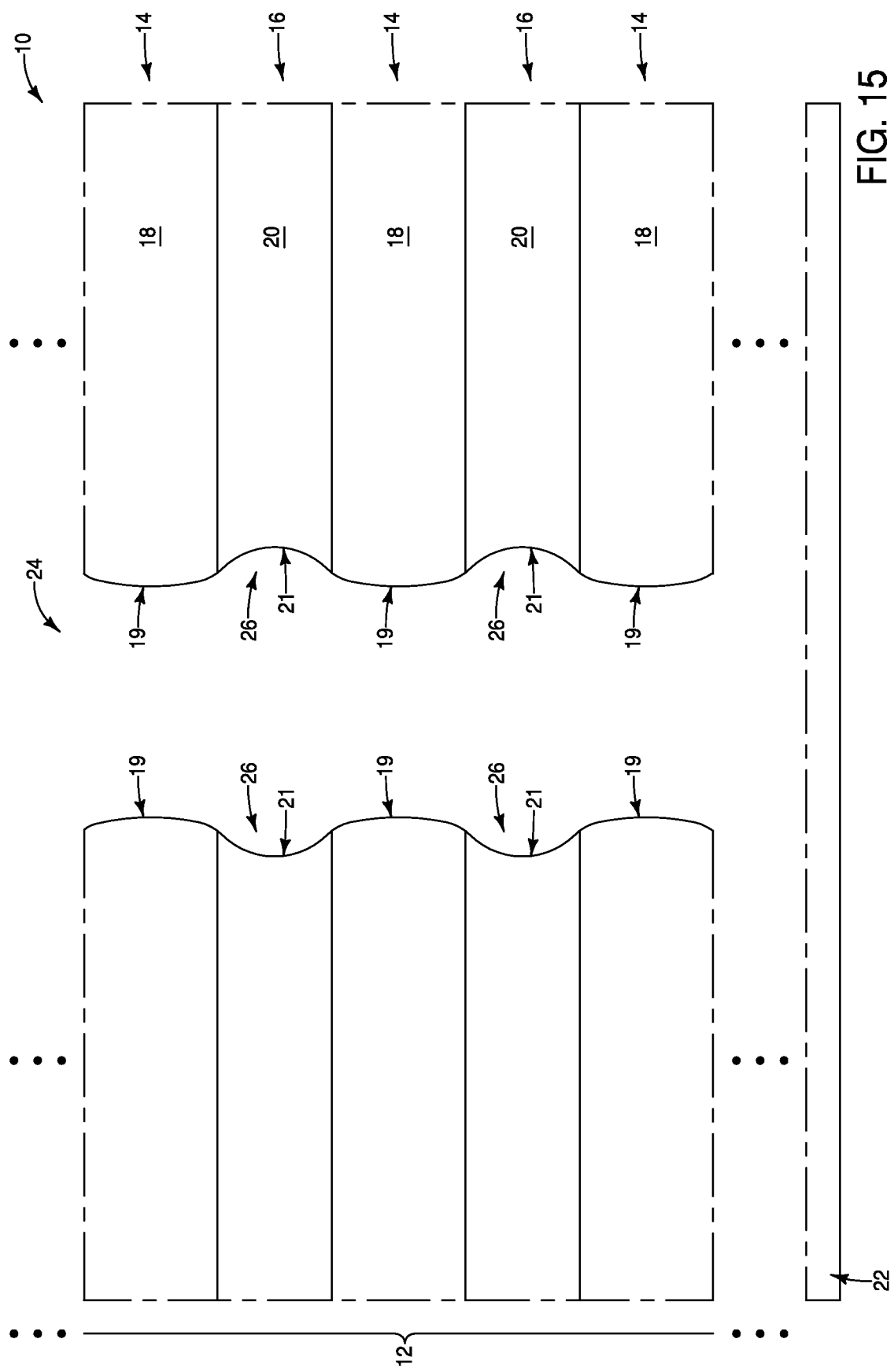
FIGS. 15-19 are diagrammatic cross-sectional views of regions of a construction at example process steps of an example method for fabricating an example assembly. The processing stage of FIG. 15 may follow that of FIG. 6.

Referring to FIG. 15, the construction 10 is shown at a processing stage subsequent to that of FIG. 6 and analogous to that of FIG. 7.

Figure 16:
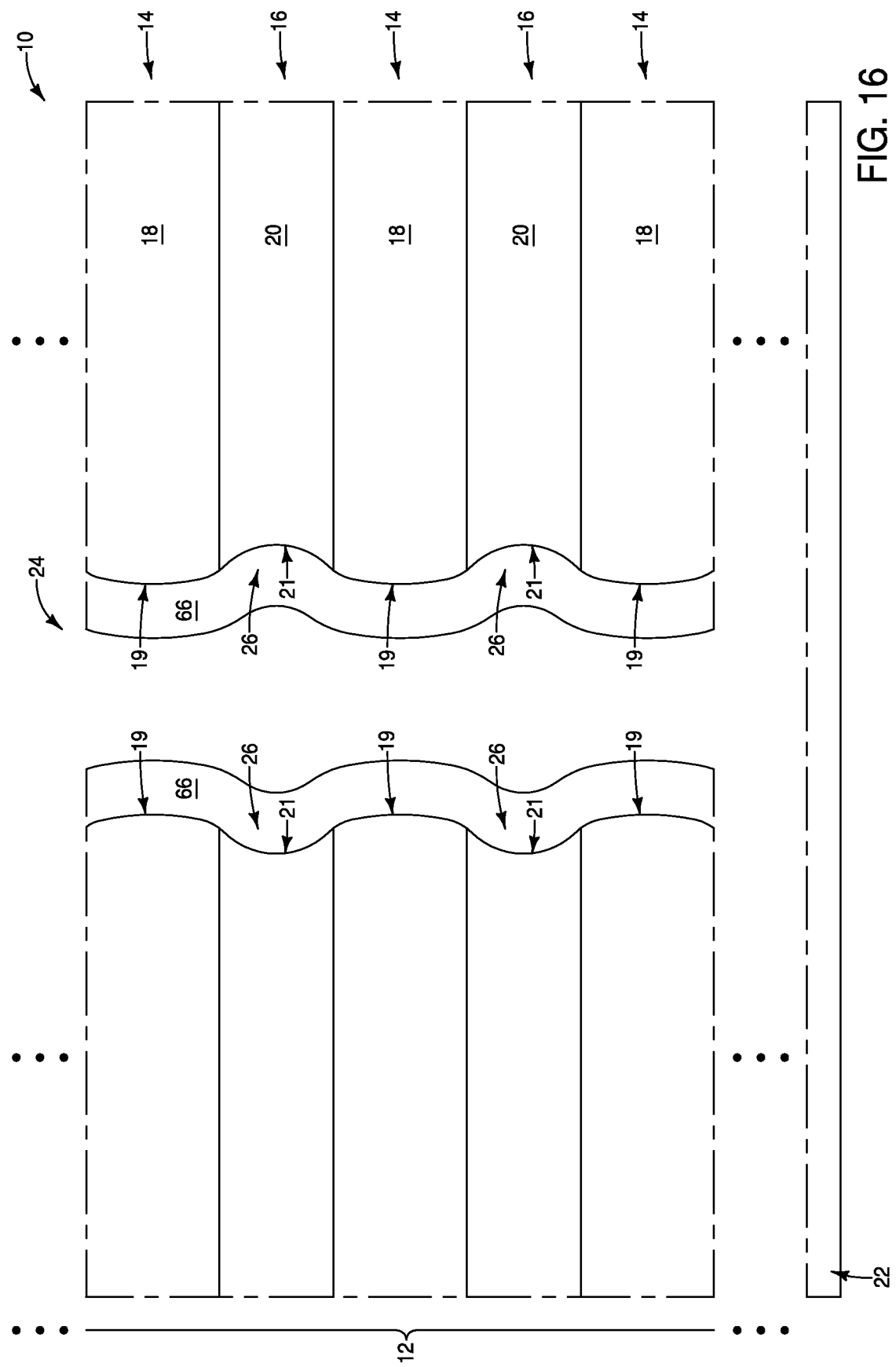

Referring to FIG. 16, insulative material 66 is formed within the opening 24 and along the edges 19 and 21 of the first and second materials 18 and 20. In some embodiments, the material 66 may be referred to as an insulative third material to distinguish it from other insulative materials. The material 66 extends into the recesses 26. The material 66 may comprise any suitable composition(s), and in some embodiments may comprise, consist essentially of, or consist of silicon dioxide.

The material 66 may be formed to any suitable horizontal thickness; and in some embodiments may be formed to a horizontal thickness within a range of from about 10 nm to about 15 nm.

Figure 17:
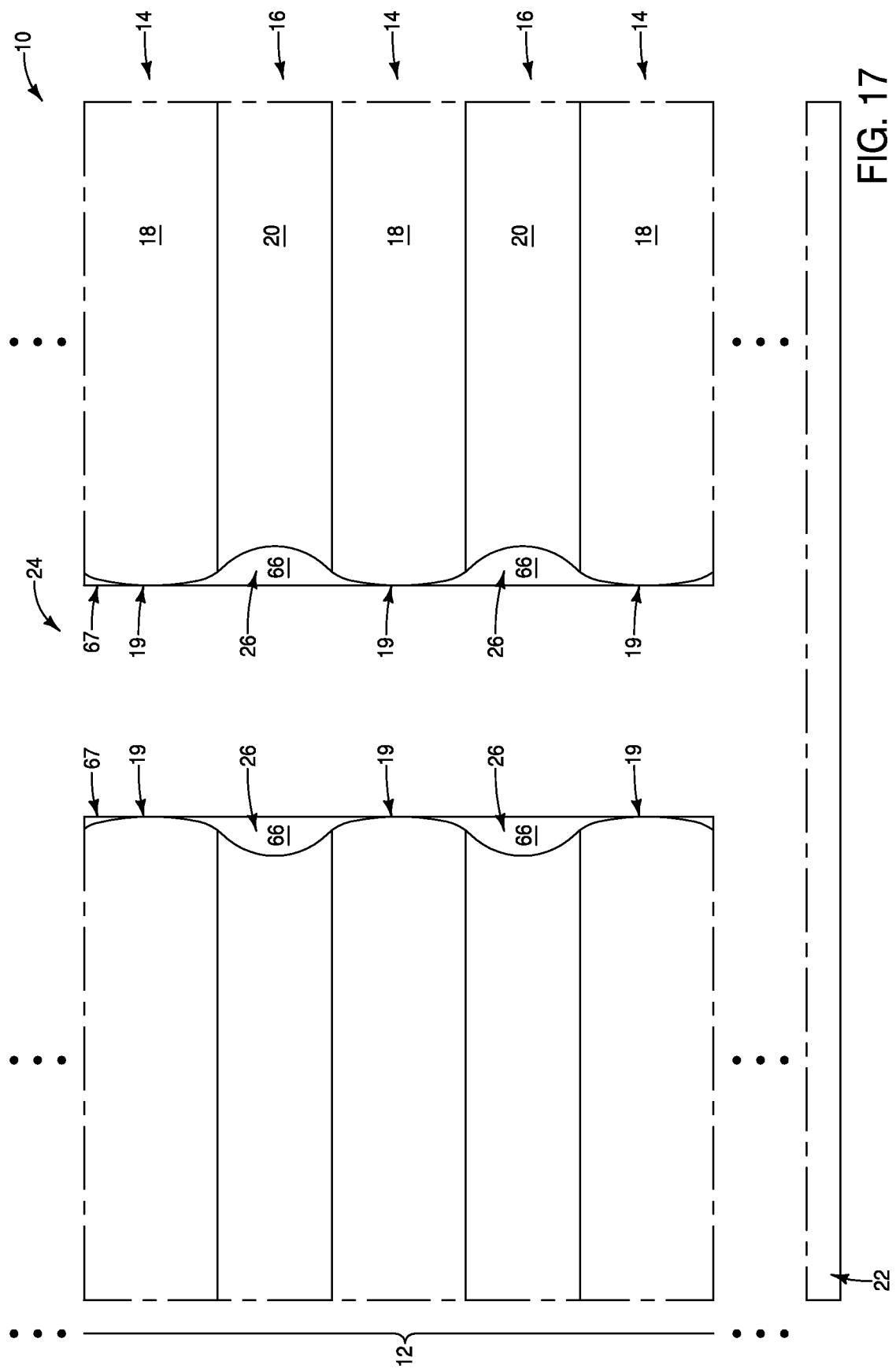

Referring to FIG. 17, the material 66 is etched to remove the material 66 from along regions of the rounded edges 19 which leaving the material 66 within the recesses 26. Such etching may utilize any suitable conditions. In some embodiments, the material 66 comprises silicon dioxide and the etching may utilize HF (e.g., buffered oxide etching conditions, vapor etching conditions, etc.).

In the shown embodiment, the etching of material 66 forms substantially vertical surfaces 67 along the interior of opening 24; with such substantially vertical surfaces 67 including regions of the surfaces 19 of the first material 18, and regions of the remaining surfaces of material 66. The term "substantially vertical" means vertical to within reasonable tolerances of fabrication and measurement.

Figure 18:
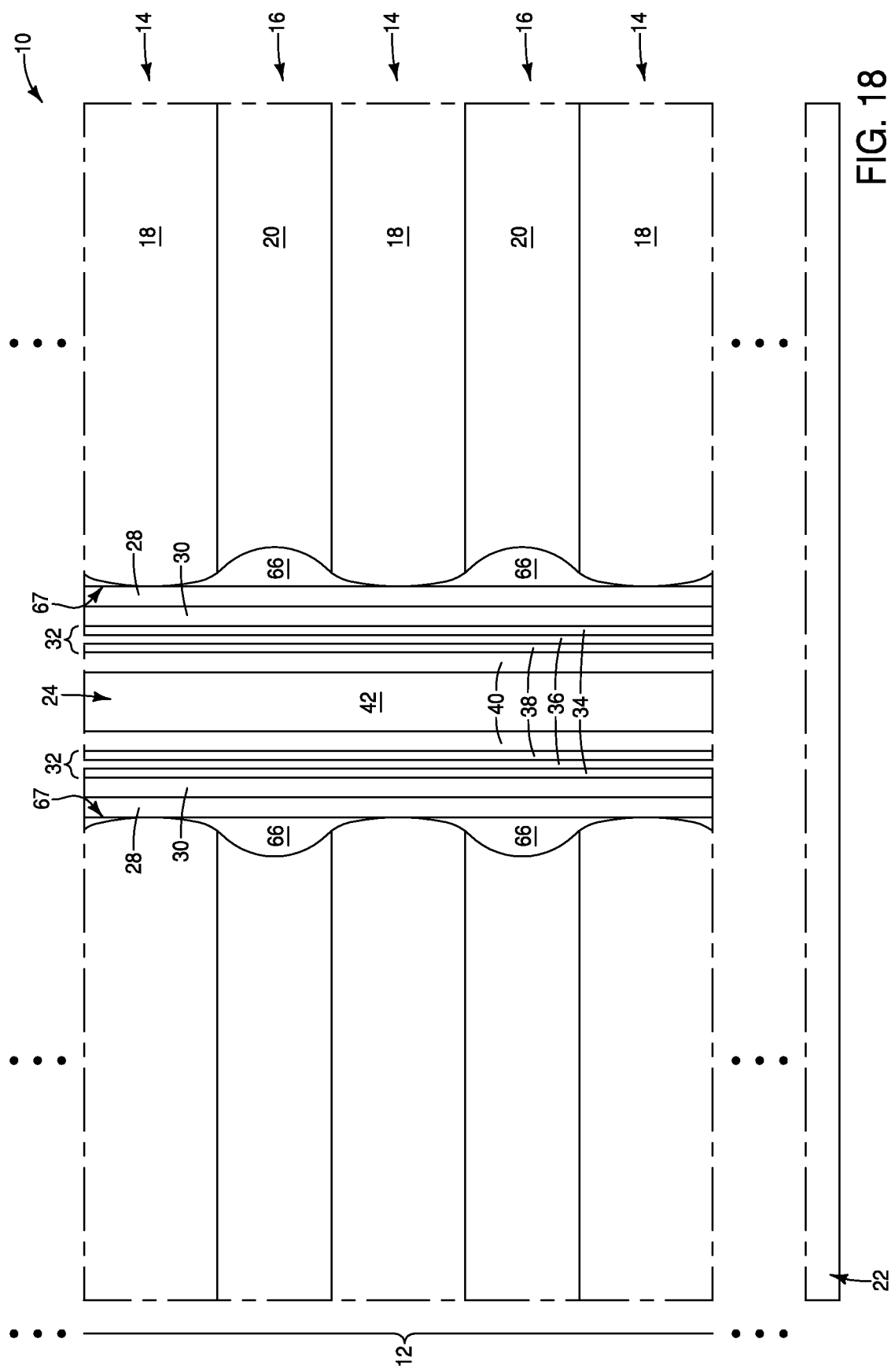

Referring to FIG. 18, the charge-blocking material 28 is formed along the surfaces 67, the charge-storage material 30 is formed adjacent the charge-blocking material, the tunneling structures 32 are formed adjacent the charge-trapping material, and the channel material 40 is formed adjacent the tunneling structures. In the illustrated embodiment, the channel material 40 lines a periphery of the opening 24, and the insulative material 42 fills a remaining interior region of the opening 24.

In the embodiment of FIG. 18, the charge-blocking material may, for example, comprise, consist essentially of, or consist of one or both of silicon dioxide and silicon oxynitride.

Figure 19:
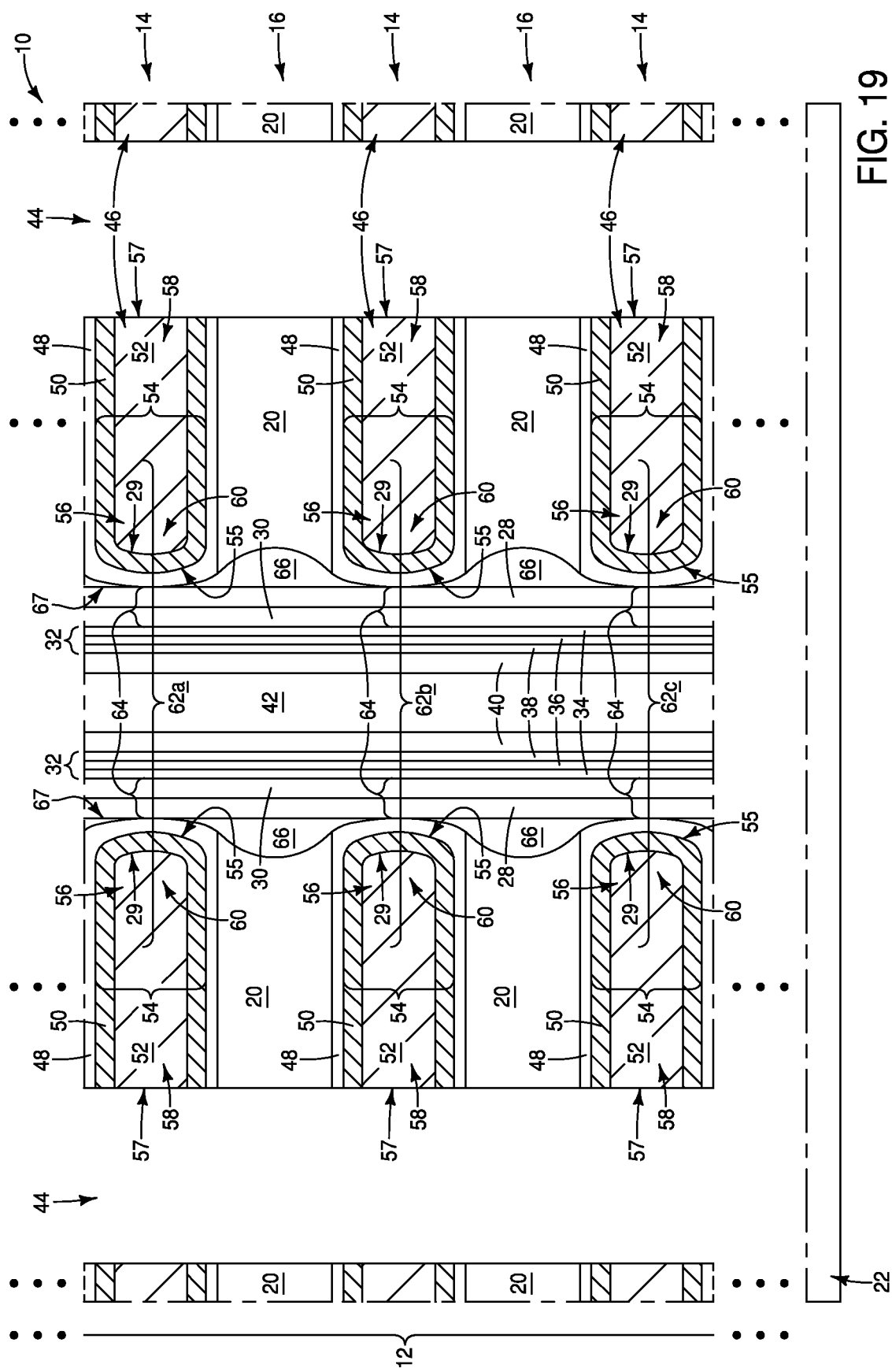

Referring to FIG. 19, the construction 10 of FIG. 18 is shown after being subjected to processing analogous to that described above with reference to FIGS. 12-14. The construction includes the dielectric barrier material 48. The construction also includes the conductive segments (or regions) 54 comprising the conductive materials 50 and 52. The conductive segments 54 comprise the portions corresponding to conductive gates 56 having first ends 55, and comprise the portions corresponding to the wordlines 58 having second ends 57. The gate ends 55 are rounded, and specifically are patterned by the rounded edges 19 shown in FIG. 15. Accordingly, the gates 56 comprise the rounded noses 60. Such rounded noses may have any suitable shapes, and in some embodiments may have substantially parabolic shapes.

The assembly 10 of FIG. 19 may be considered to show a portion of a memory array (e.g., a NAND memory array). Such array comprises the vertical stack 12 of alternating insulative levels 16 and wordline levels 14.

The memory array includes memory cells 62a, 62b and 62c. The charge-blocking material 28 and charge-storage material 30 within a memory cell may be together considered to be the memory cell structure 64. As discussed above, the charge-blocking material 28 within the memory cell structure 64 may be referred to as the charge-blocking region of the memory cell structure, and the charge-storage material within the memory cell structure may be referred to as the charge-storage region of the memory cell structure. In the shown embodiment the charge-blocking material 28 is configured as a vertically-extending layer which extends substantially conformally to the channel material 40, and the charge-blocking regions are along such vertically-extending layer.

Figure 20:
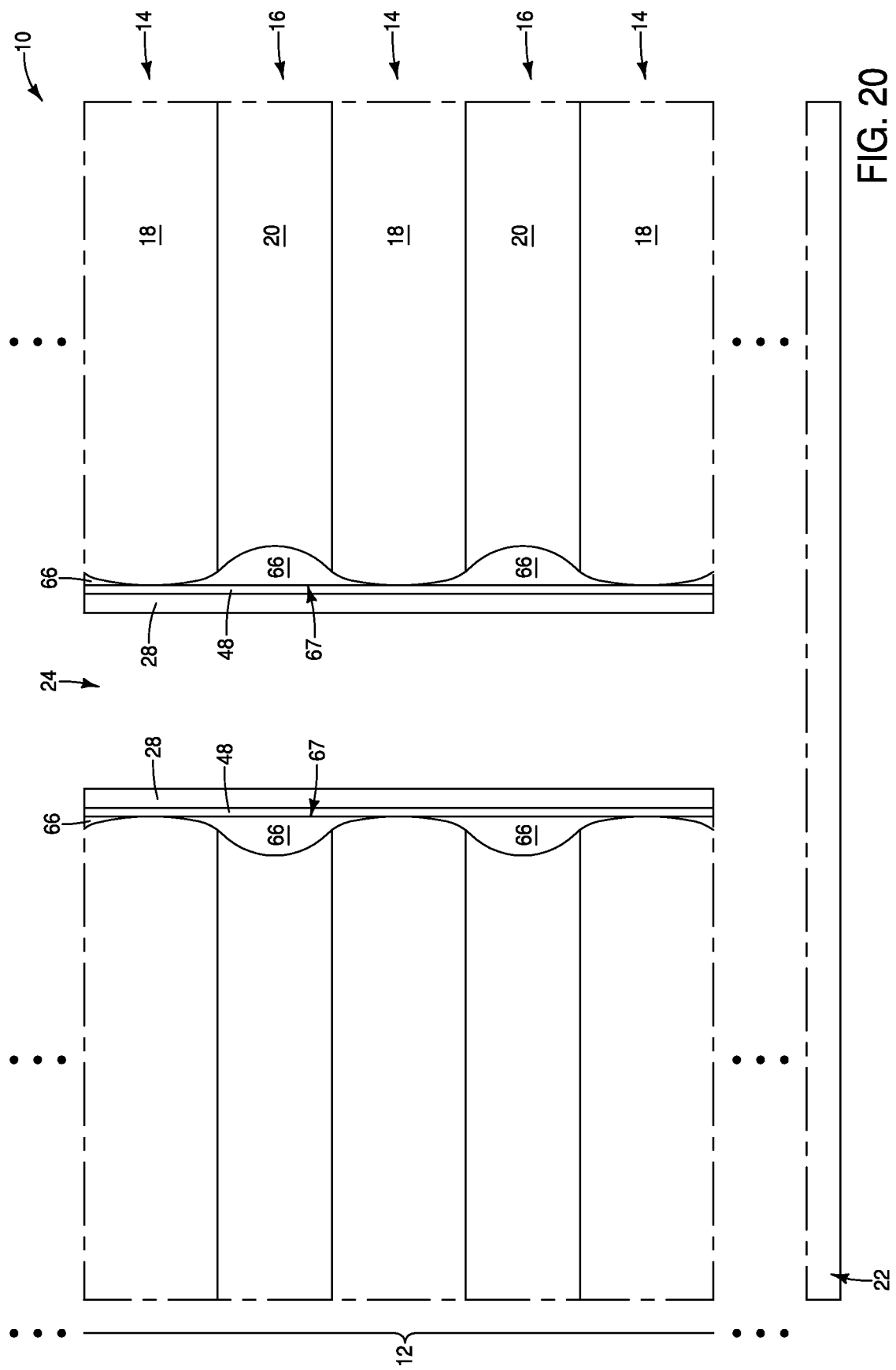
FIGS. 20-22 are diagrammatic cross-sectional views of regions of a construction at example process steps of an example method for fabricating an example assembly. The processing stage of FIG. 20 may follow that of FIG. 17.

In some embodiments, the dielectric barrier material 48 may be formed along the surface 67 (FIG. 17) in addition to, or alternatively to, being formed within the cavities 46 (FIG. 12). FIG. 20 shows construction 10 at a processing stage following that of FIG. 17. The dielectric barrier material 48 is formed as vertically-extending layers along the surfaces 67, and the charge-blocking material 28 is formed along the dielectric barrier material 48.

Figure 21:
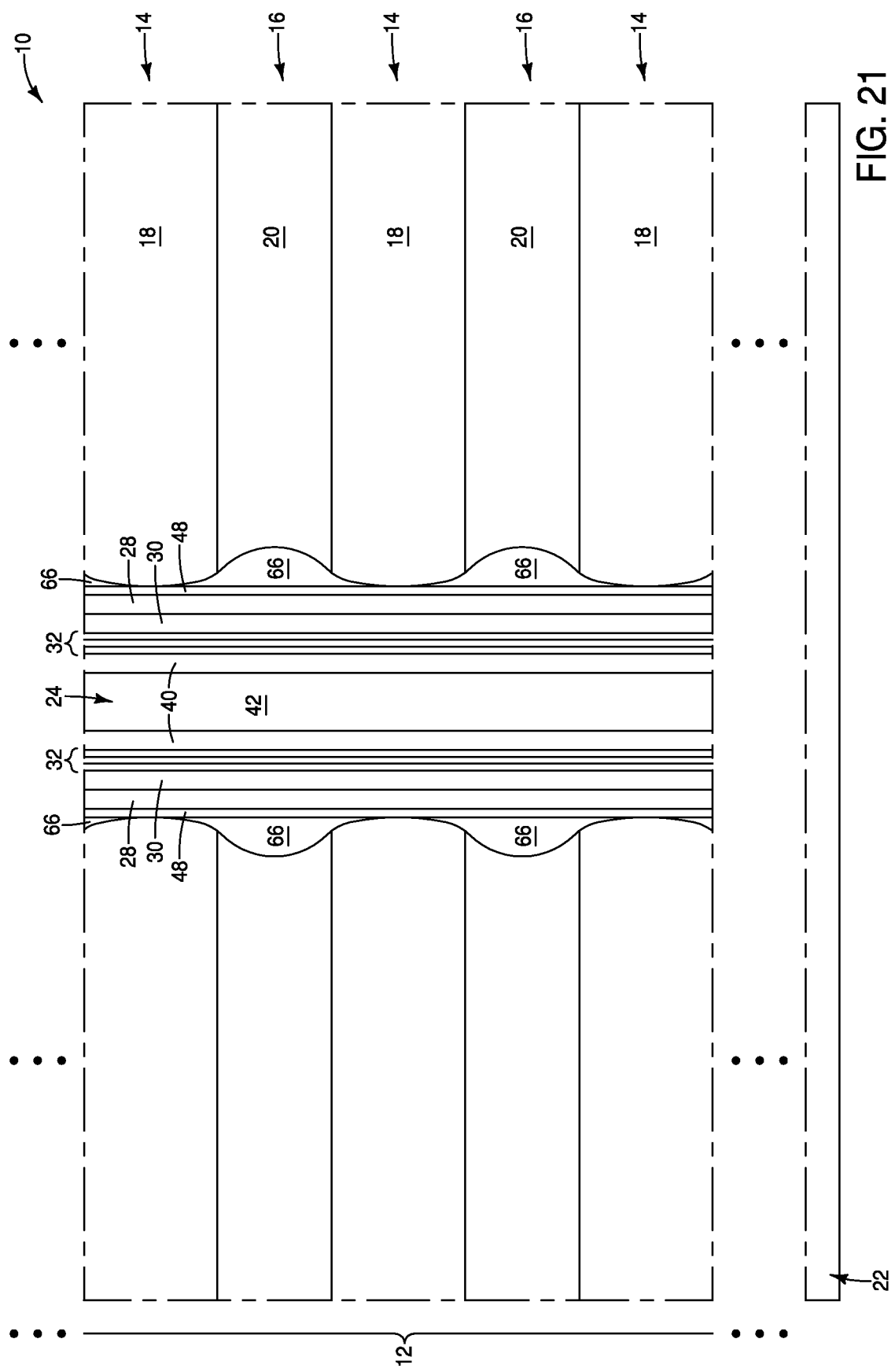

Referring to FIG. 21, the charge-storage material 30 is formed adjacent the charge-blocking material 28, the tunneling structures 32 are formed adjacent the charge-trapping material, and the channel material 40 is formed adjacent the tunneling structures. In the illustrated embodiment, the channel material 40 lines a periphery of the opening 24, and the insulative material 42 fills a remaining interior region of the opening 24.

Figure 22:
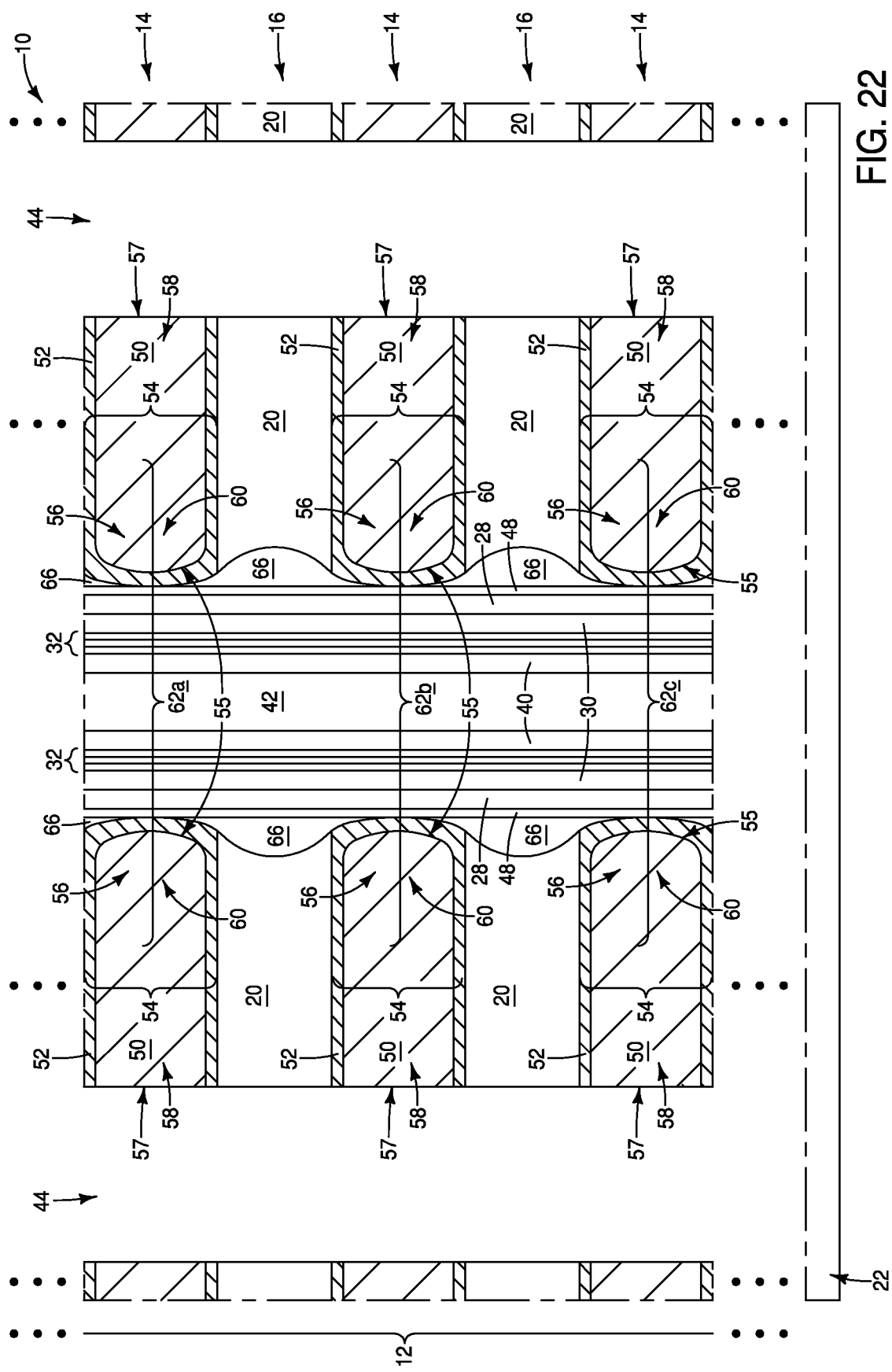

Referring to FIG. 22, the construction 10 of FIG. 21 is shown after being subjected to processing analogous to that described above with reference to FIGS. 12-14. The construction includes the conductive segments (or regions) 54 comprising the conductive materials 50 and 52. The conductive segments 54 comprise the portions corresponding to conductive gates 56 having first ends 55, and comprise the portions corresponding to the wordlines 58 having second ends 57.

The memory array includes memory cells 62a, 62b and 62c. In the shown embodiment, the channel material 40 extends vertically along the vertically-stacked memory cells 62a, 62b and 62c. The charge-blocking material 28 is configured as a layer which extends substantially conformally to the channel material 40, and the dielectric barrier material 48 is configured as a layer which extends substantially conformally to the layer of the charge-blocking material 28.

Figure 23:
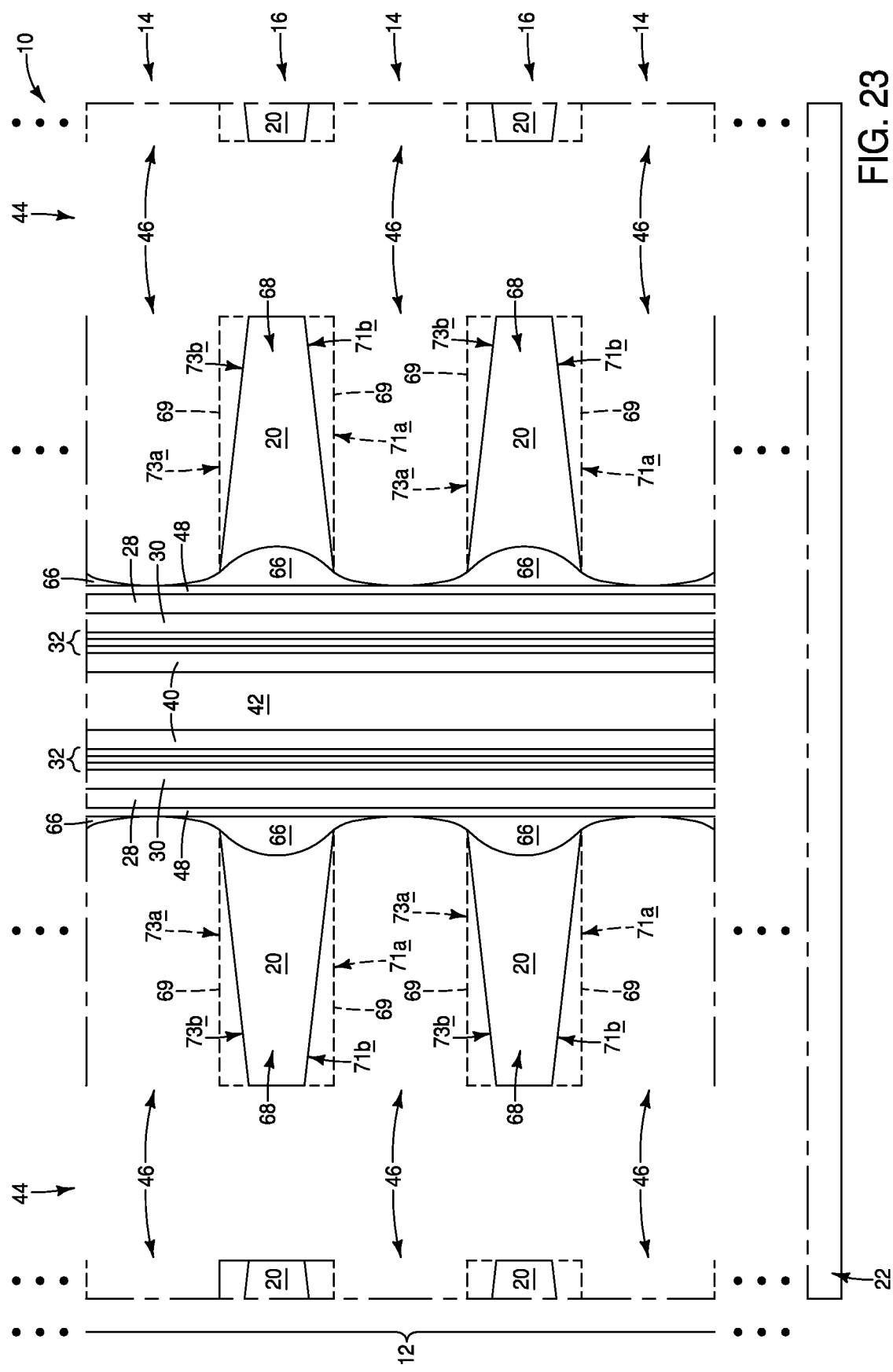
FIGS. 23-26 are diagrammatic cross-sectional views of regions of a construction at example process steps of an example method for fabricating an example assembly. The processing stage of FIG. 23 may follow that of FIG. 21.

In some embodiments, the shapes of the cavities 46 (FIG. 12) may be modified. FIG. 23 shows a processing stage subsequent to that of FIG. 21, and shows the material 18 removed to form the cavities 46. The regions of material 20 between the cavities may be considered to be insulative segments 68. Dashed lines 69 are provided to show initial peripheries of the segments 20 (e.g., peripheries at a process stage analogous to that of FIG. 12). Each of the cavities has an upper portion bounded by a bottom surface 71 of an insulative segment 68, and has a lower portion bounded by an upper surface 73 of an insulative segment 68. The surfaces 71 and 73 are illustrated as being surfaces 71a and 73a along the initial peripheries (i.e., the dashed-line peripheries) The processing stage of FIG. 23 shows construction 10 after etching is conducted to modify the cavities 46. Such etching etches into the surfaces of the segments 68. The etching drops regions of the upper surfaces 73 of the segments 68 to new positions labeled 73b, and raises regions of the lower surfaces 71 of such segments to new positions labeled 71b; and thereby widens regions of the cavities 46 proximate the slits 44.

Figure 24:
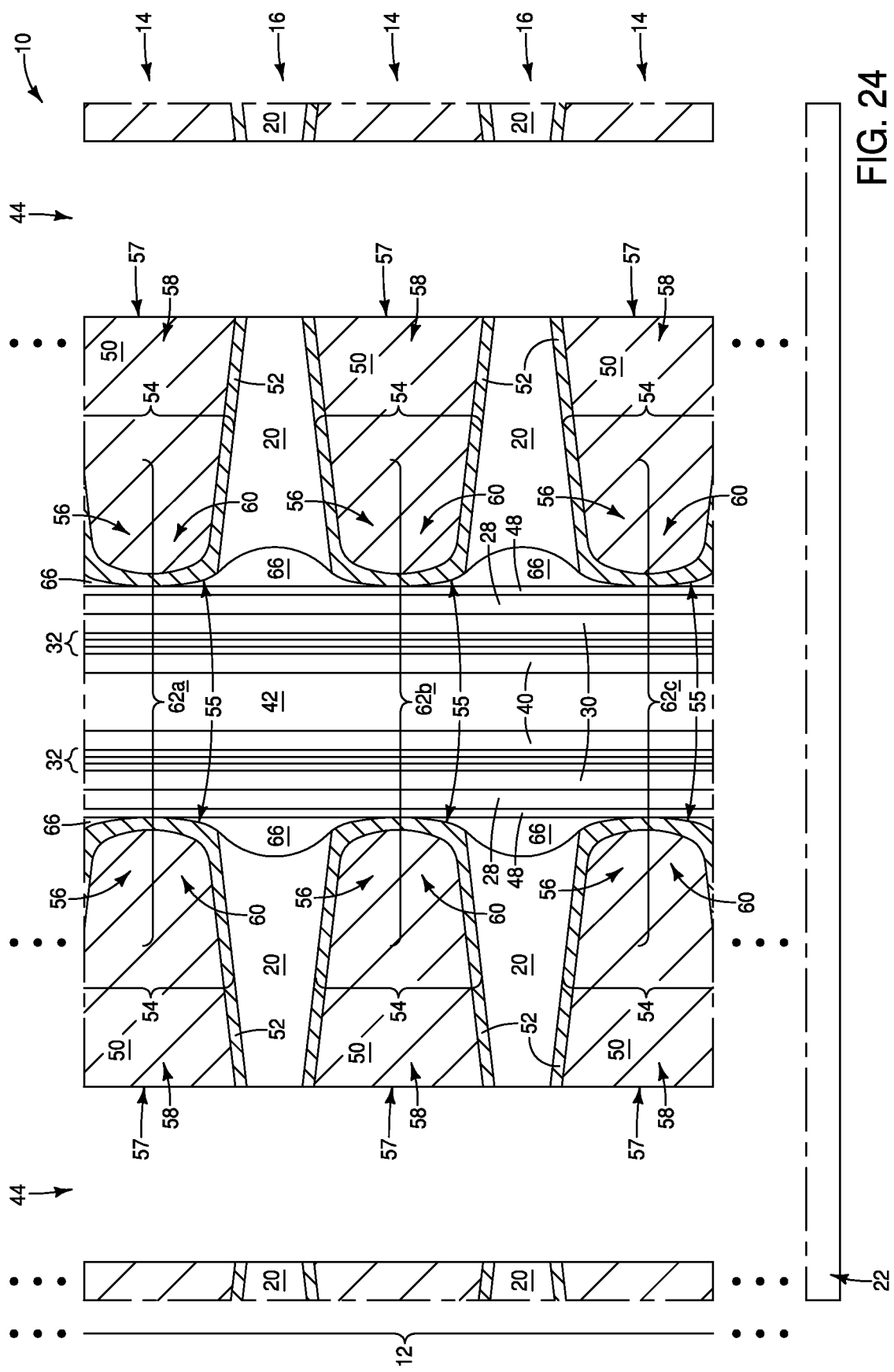

Referring to FIG. 24, the construction 10 of FIG. 23 is shown at a processing stage analogous to that described above with reference to FIG. 22. The construction includes the conductive segments (or regions) 54 comprising the conductive materials 50 and 52. The conductive segments 54 comprise the portions corresponding to conductive gates 56 having first ends 55, and comprise the portions corresponding to the wordlines 58 having second ends 57. An advantage of the construction of FIG. 24 relative to that of FIG. 22 is that the wordlines 58 of the FIG. 24 construction are thicker than those of the FIG. 22 construction. Such may enable the wordlines to have reduced resistance (i.e., increased conductance) as compared to the wordlines of the embodiment of FIG. 22.

Figure 25:
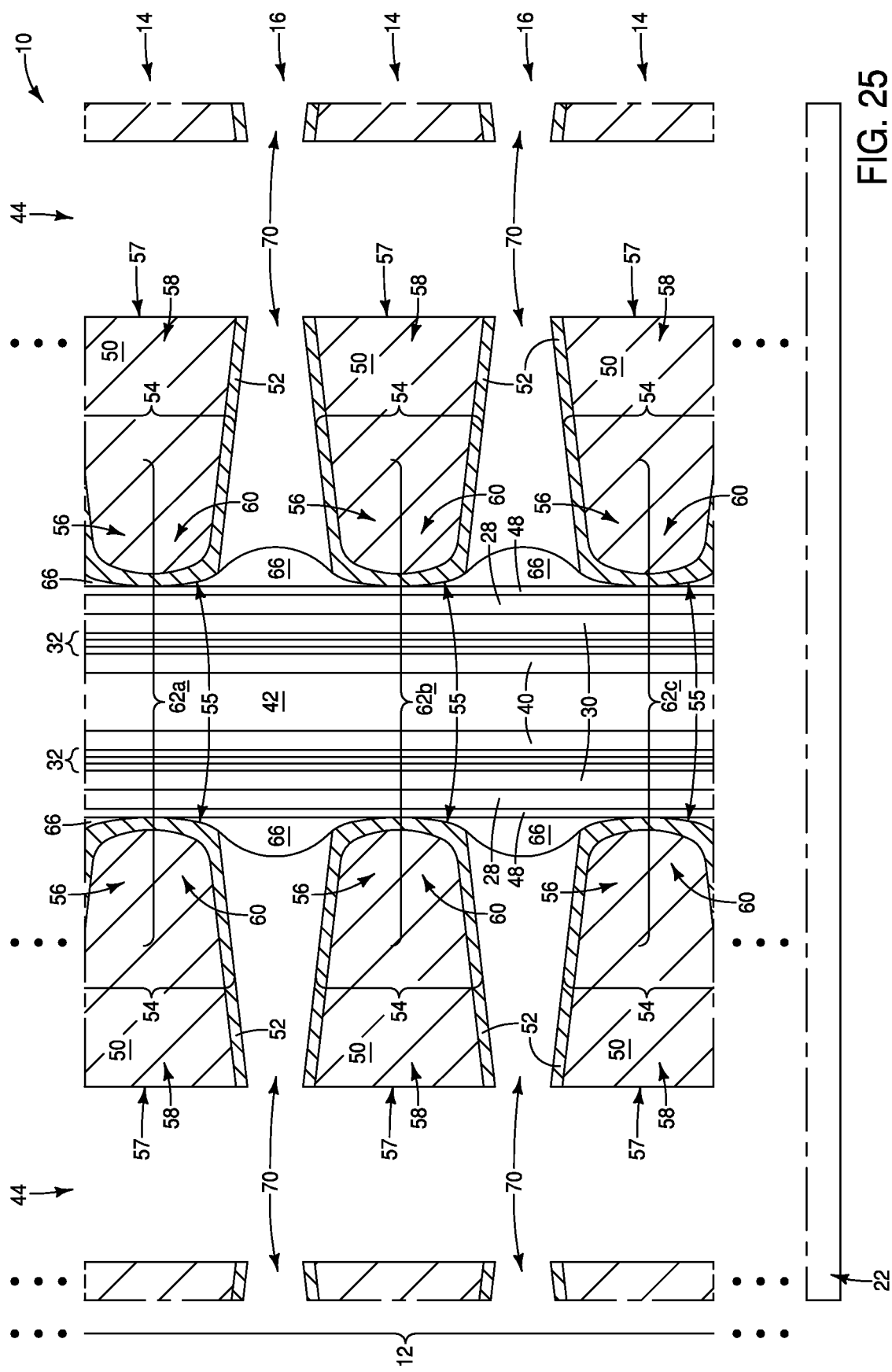

In some embodiments, it may be desired to replace at least some of the insulative material 20 with voids in order to reduce a dielectric constant of regions between vertically-neighboring conductive structures and thereby reduce undesired parasitic capacitance. FIG. 25 shows construction 10 at a processing stage which may follow that of FIG. 24. The insulative material 20 (FIG. 24) has been removed with one or more suitable etches to form voids 70. Such voids 70 are between regions of vertically-adjacent conductive segments 54.

Figure 26:
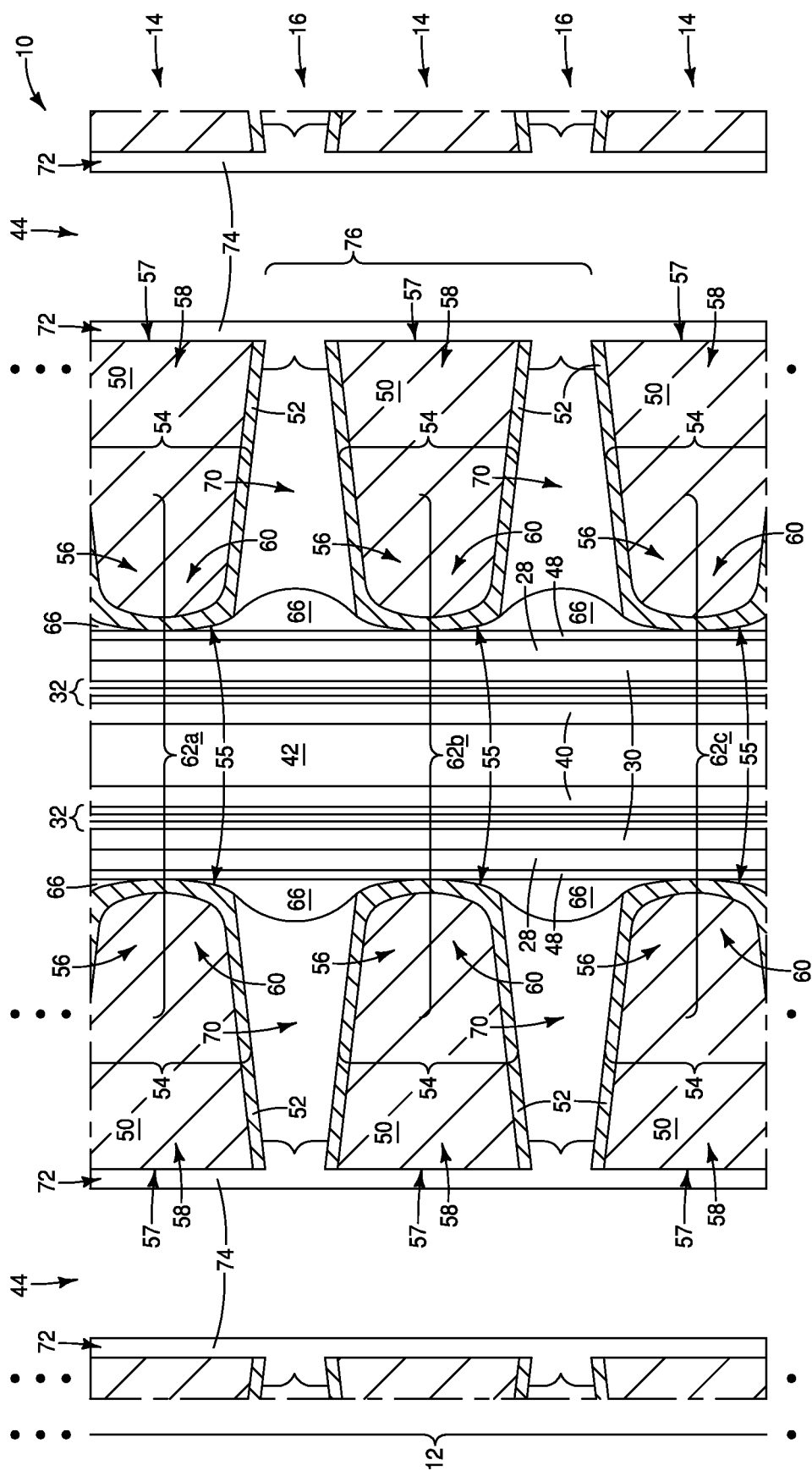

Referring to FIG. 26, insulative liners 72 may be formed along the slits 44. The insulative liners comprise insulative material 74. Such insulative material may comprise any suitable composition(s); such as, for example, silicon dioxide or low-k silicon dioxide (with the term low-k meaning a dielectric constant less than that of traditional silicon dioxide). Low-k silicon dioxide may be silicon dioxide which is more porous than traditional silicon dioxide. The liner material seals the voids 70, and in some embodiments may extend partially into the voids 70 (as shown). In some embodiments, the insulative liners 72 may be considered to comprise liner regions 76 which extend around the second ends 57 of the conductive segments 54 and into the voids 70.

The embodiments described above have the charge-storage material 30 extending continuously along the wordlines levels 14 and the insulative levels 16. In other embodiments, the charge-storage material may be configured as segments along the wordline levels 14, with vertically-neighboring segments being spaced from one another by breaks along the insulative levels 16. Such may advantageously reduce cross-coupling between vertically-adjacent memory cells in some applications.

Figure 27B:
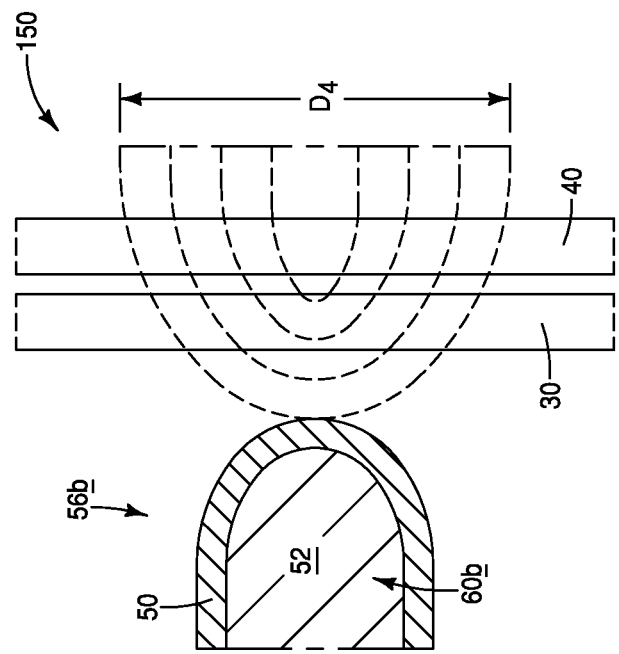
FIGS. 27A and 27B are diagrammatic cross-sectional views of regions of example constructions showing advantages of a rounded-nose-shaped (e.g., parabolic-shaped) gate (FIG. 27B) relative to a non-rounded-nose-shaped gate (FIG. 27A).
Figure 27A:
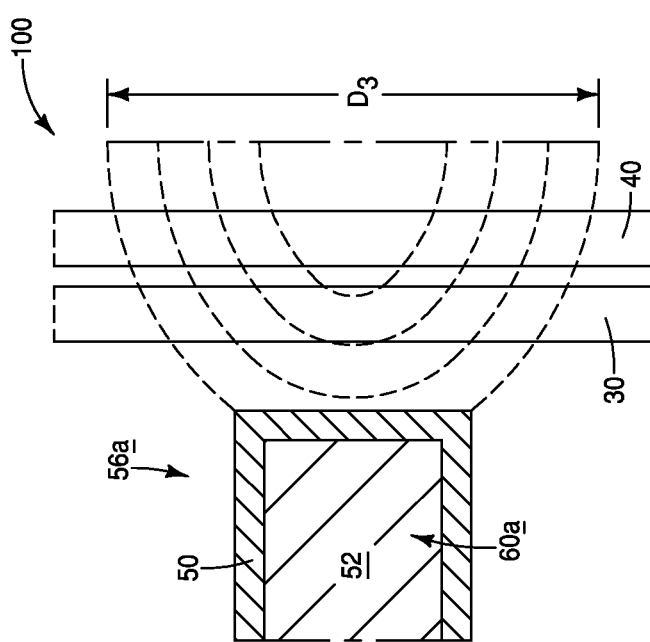

The embodiments described herein may advantageously enable improved control over charge-trapping as compared to conventional memory cell configurations, and may reduce disturbance between vertically-adjacent memory cells as compared to conventional configurations. Such may enable faster programming speeds and improved retention as compared to conventional configurations. FIGS. 27A and 27B compare a conventional configuration 100 with a configuration 150 representative of an embodiment of the present invention. The configuration 100 comprises a gate 56a having a nose 60a with a square-shaped configuration. In contrast, the configuration 150 comprises a gate 56b having a nose 60b with a rounded (e.g., parabolic) configuration. The gate 56b better concentrates an electric field (indicated with dashed lines) that passes across charge-storage material 30 and channel material 40, as compared to the gate 56a; and specifically the electric field of the conventional configuration 100 is dispersed across a distance $D_3$, while a comparable electric field of the configuration 150 is concentrated within a smaller distance $D_4$. The improved concentration of the electric field achieved with embodiments described herein may advantageously enable the electric field to be enhanced within a small region of the charge-storage material, leading to faster programming. The improved concentration of the electric field may also advantageously reduce the likelihood of cross-coupling between vertically-adjacent memory cells as compared to conventional memory cell configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory array having a vertical stack of alternating insulative levels and wordline levels. Channel material extends vertically along the stack. Conductive segments are along the wordline levels. Individual of the conductive segments has, along a cross-section, first and second ends in opposing relation to one another. The conductive segments include gates and wordlines adjacent the gates. The wordlines encompass the second ends, and the gates have substantially parabolic noses which encompass the first ends. Memory cell structures are along the wordline levels and are located between the channel material and the parabolic noses of the gates. The memory cell structures include charge-storage regions and charge-blocking regions. The charge-blocking regions are being between the charge-storage regions and the gates.

Some embodiments include a method of forming an assembly. A first opening is formed through a stack of alternating first and second levels. The first levels comprise a first material, and the second levels comprise an insulative second material. The first levels comprise edges along the first opening. The edges of the first levels are rounded, and charge-blocking material is formed adjacent the rounded edges. Charge-storage material is formed adjacent the charge-blocking material. Tunneling material is formed adjacent the charge-storage material. Channel material is formed within the first opening and adjacent the tunneling material. A second opening is formed through the stack. After the second opening is formed, the first material of the first levels is removed to form cavities. Conductive segments are formed within the cavities. Each of the conductive segments has, along a cross-section, first and second ends in opposing relation to one another. The conductive segments comprise gates, and comprise wordlines adjacent the gates. The wordlines encompass the second ends. The gates have rounded noses encompassing the first ends. The rounded noses are patterned by the rounded edges of the first levels.

Some embodiments include a method of forming an assembly. A first opening is formed through a stack of alternating first and second levels. The first levels comprise silicon nitride, and the second levels comprise silicon dioxide. The first levels comprise edges along the first opening. The edges of the first level are rounded. Charge-blocking material is formed adjacent the rounded edges. The charge-blocking material has an inner surface which is substantially conformal to the rounded edges. Charge-storage material is formed adjacent the charge-blocking material. Tunneling material is formed adjacent the charge-storage material. Channel material is formed within the first opening and adjacent the tunneling material. A second opening is formed through the stack. The silicon nitride of the first levels is removed to form cavities. Conductive segments are formed within the cavities. Each of the conductive segments has, along a cross-section, first and second ends in opposing relation to one another. The conductive segments comprise gates, and comprise wordlines adjacent the gates, the wordlines encompass the second ends. The gates have rounded noses encompassing the first ends. The rounded noses are molded by the inner surface of the charge-blocking material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory array, comprising:
   a vertical stack of alternating insulative levels and wordline levels;
   channel material extending vertically along the stack;
   conductive segments along the wordline levels; individual of the conductive segments having, along a cross-section, first and second ends in opposing relation to one another; the conductive segments comprising gates and wordlines adjacent the gates; the wordlines encompassing the second ends; the gates having substantially parabolic noses encompassing the first ends, the substantially parabolic noses extending outwardly toward the channel material; and
   memory cell structures along the wordline levels and located between the channel material and the parabolic noses of the gates; the memory cell structures including charge-storage regions and charge-blocking regions; the charge-blocking regions being between the charge-storage regions and the gates.

2. The memory array of claim 1 comprising dielectric barrier material between the charge-blocking regions and the substantially parabolic noses of the gates.

3. The memory array of claim 2 wherein the dielectric barrier material comprises one or more of hafnium oxide, zirconium oxide, aluminum oxide, hafnium silicate, zirconium silicate, titanium oxide, gadolinium oxide, niobium oxide and tantalum oxide.

4. The memory array of claim 2 wherein the dielectric barrier material is substantially conformal to the substantially parabolic noses of the gates.

5. The memory array of claim 2 wherein the charge-blocking regions are along a vertically-extending charge-blocking material which extends substantially conformally to the channel material; and wherein the dielectric barrier material extends substantially conformally to the charge-blocking material.

6. The memory array of claim 1 comprising voids along the insulative levels and between vertically-neighboring of the memory cell structures.

7. The memory array of claim 6 comprising insulative liner regions along the wordline levels and extending around the second ends of the conductive segments and into the voids.

8. The memory array of claim 1 wherein the channel material comprises silicon.

9. The memory array of claim 1 wherein the charge-storage regions comprise silicon nitride.

10. The memory array of claim 1 wherein the charge-blocking regions comprise one or both of silicon oxynitride and silicon dioxide.

* * * * *